(12) United States Patent
Lee

(10) Patent No.: US 12,293,805 B2
(45) Date of Patent: May 6, 2025

(54) MANUFACTURING METHOD OF FORMING A SEMICONDUCTOR MEMORY DEVICE WITH IMPROVED STRUCTURAL STABILITY AND PROCESS DEFECTS

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 475 days.

(21) Appl. No.: 17/856,741

(22) Filed: Jul. 1, 2022

(65) Prior Publication Data

US 2022/0335980 A1    Oct. 20, 2022

Related U.S. Application Data

(63) Continuation of application No. 16/884,599, filed on May 27, 2020, now Pat. No. 11,410,708.

(30) Foreign Application Priority Data

Dec. 6, 2019    (KR) .......................... 10-2019-0161844

(51) Int. Cl.
   *G11C 5/02* (2006.01)
   *G11C 5/06* (2006.01)
   (Continued)

(52) U.S. Cl.
   CPC ................ *G11C 5/025* (2013.01); *G11C 5/06* (2013.01); *H01L 23/5226* (2013.01); *H10B 41/27* (2023.02); *H10B 43/27* (2023.02)

(58) Field of Classification Search
   CPC ....... G11C 5/025; G11C 5/06; G11C 16/0483; H01L 23/5226; H01L 21/76805;
   (Continued)

(56) References Cited

U.S. PATENT DOCUMENTS

| 8,697,498 B2 * | 4/2014 | Jang ...................... H01L 21/762 438/257 |
| 9,412,753 B2 | 8/2016 | Izumi et al. |

(Continued)

FOREIGN PATENT DOCUMENTS

| CN | 102468283 A | 5/2012 |
| CN | 106409811 A | 2/2017 |

(Continued)

*Primary Examiner* — William B Partridge
*Assistant Examiner* — Chevy J Boegel
(74) *Attorney, Agent, or Firm* — WILLIAM PARK & ASSOCIATES LTD.

(57) ABSTRACT

Provided herein is a semiconductor memory device and a manufacturing method of the semiconductor memory device. The semiconductor memory device includes a contact pattern including a vertical contact part, and a sidewall contact part extending from the vertical contact part in a direction crossing the vertical contact part, a lower conductive pattern having a hole into which the vertical contact part is inserted, and an upper conductive pattern overlapping a portion of the lower conductive pattern. The upper conductive pattern includes a first side portion in contact with the sidewall contact part, and a second side portion facing the vertical contact part and spaced apart from the vertical contact part.

11 Claims, 45 Drawing Sheets

(51) Int. Cl.
  *H01L 23/522* (2006.01)
  *H10B 41/27* (2023.01)
  *H10B 43/27* (2023.01)

(58) Field of Classification Search
  CPC ......... H01L 21/76831; H01L 21/76897; H01L 23/5386; H01L 29/66833; H01L 29/792; H10B 41/27; H10B 43/27; H10B 43/50; H10B 43/30; H10B 43/35; H10B 43/40
  See application file for complete search history.

(56) References Cited

U.S. PATENT DOCUMENTS

| | | | |
|---|---|---|---|
| 9,564,451 B1* | 2/2017 | Shin | ................... H01L 21/4846 |
| 2012/0001345 A1 | 1/2012 | Park et al. | |
| 2015/0008506 A1* | 1/2015 | Yang | ................... H01L 29/7926 |
| | | | 257/324 |
| 2015/0115345 A1* | 4/2015 | Nowak | ............. H01L 29/66833 |
| | | | 257/314 |
| 2015/0340371 A1 | 11/2015 | Lue | |
| 2018/0358376 A1* | 12/2018 | Hwang | ................... H10B 43/40 |
| 2019/0035806 A1* | 1/2019 | Jung | ................. H01L 21/76877 |
| 2021/0134832 A1* | 5/2021 | Choi | ................... H01L 23/535 |
| 2022/0139945 A1* | 5/2022 | Jung | ....................... H01L 25/18 |
| | | | 257/324 |

FOREIGN PATENT DOCUMENTS

| | | |
|---|---|---|
| CN | 109326598 A | 2/2019 |
| CN | 109659308 A | 4/2019 |
| CN | 110473878 A | 11/2019 |
| KR | 1020090124236 A | 12/2009 |
| KR | 1020150139255 A | 12/2015 |
| KR | 1020190122372 A | 10/2019 |

* cited by examiner

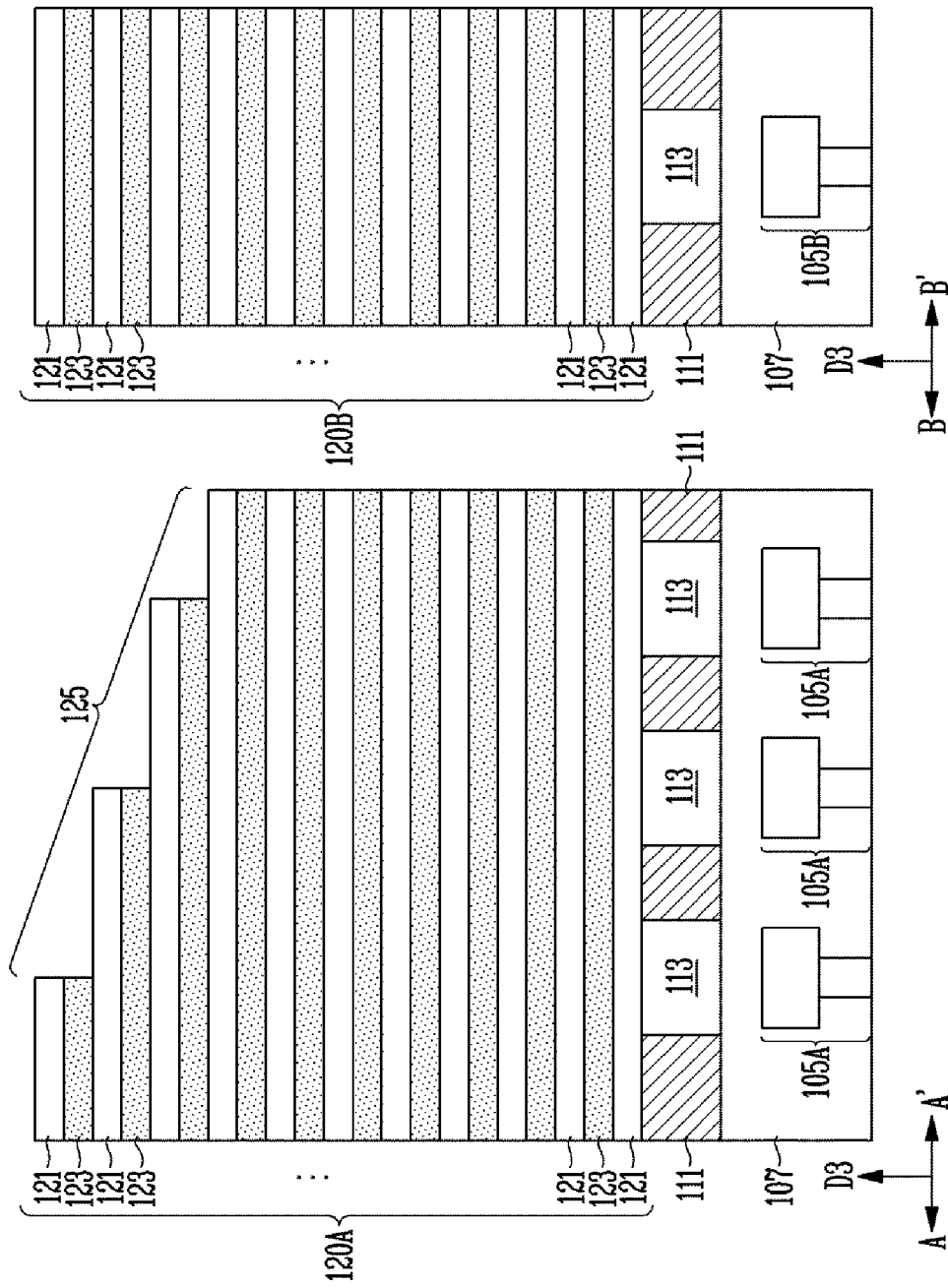

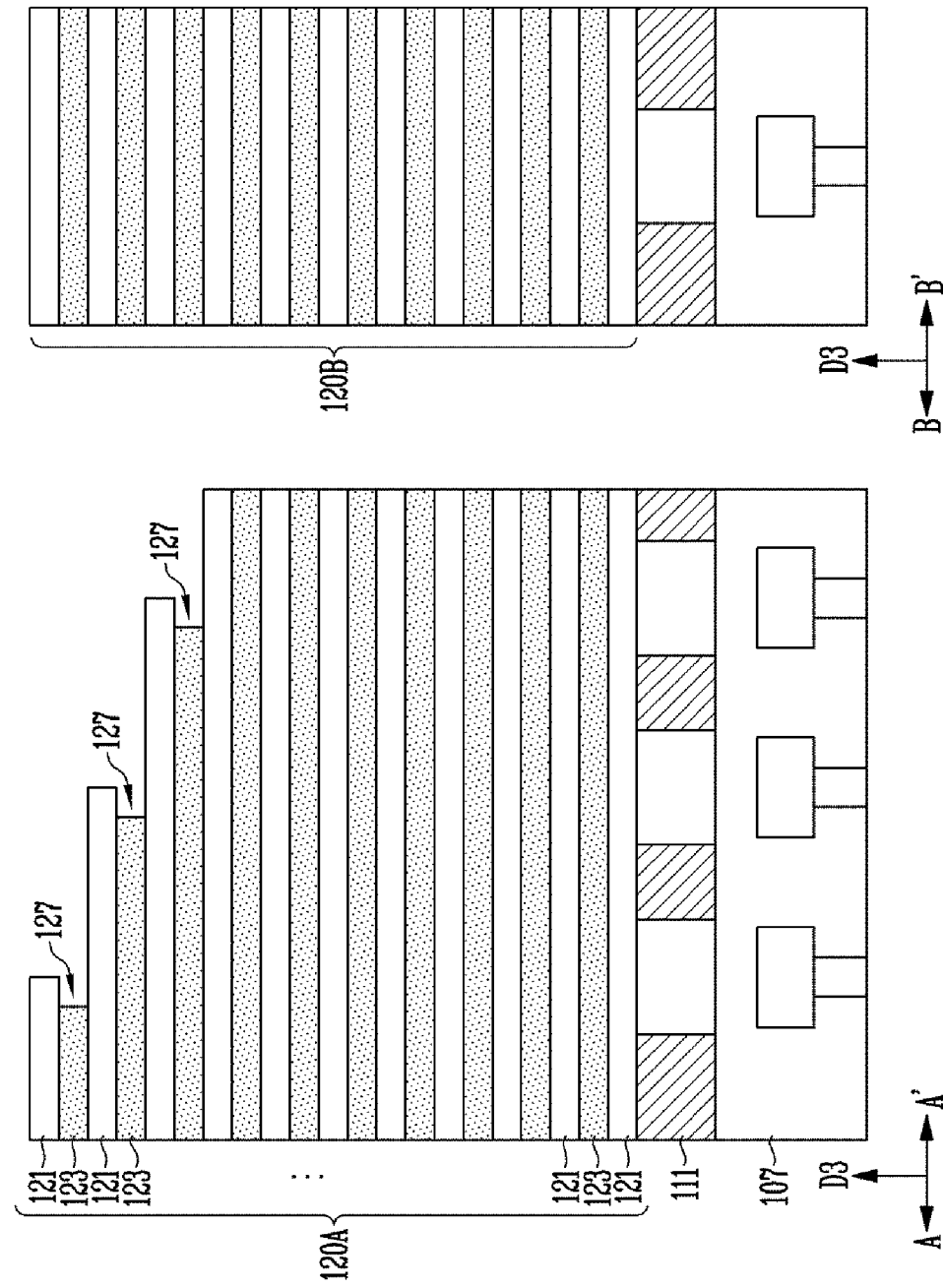

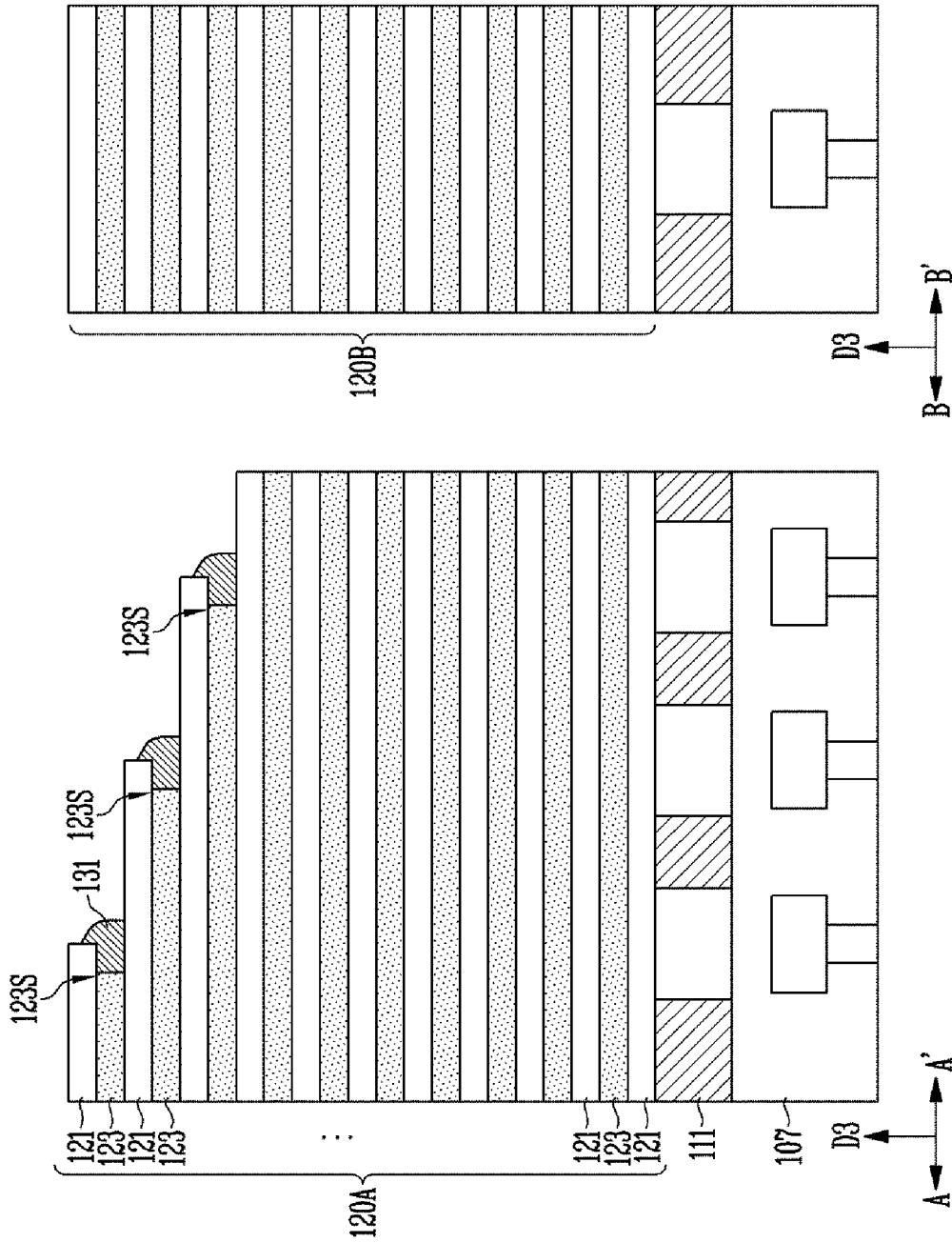

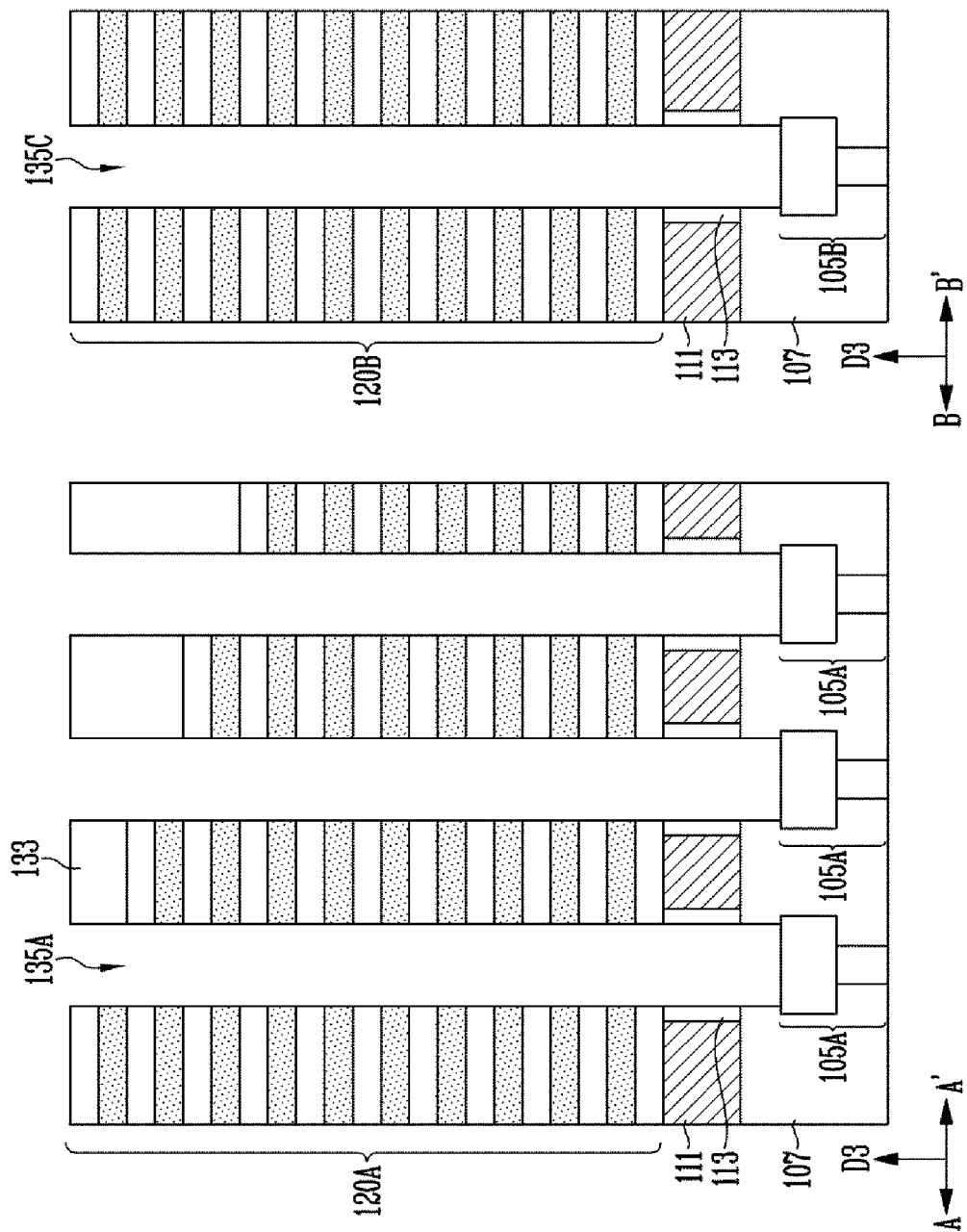

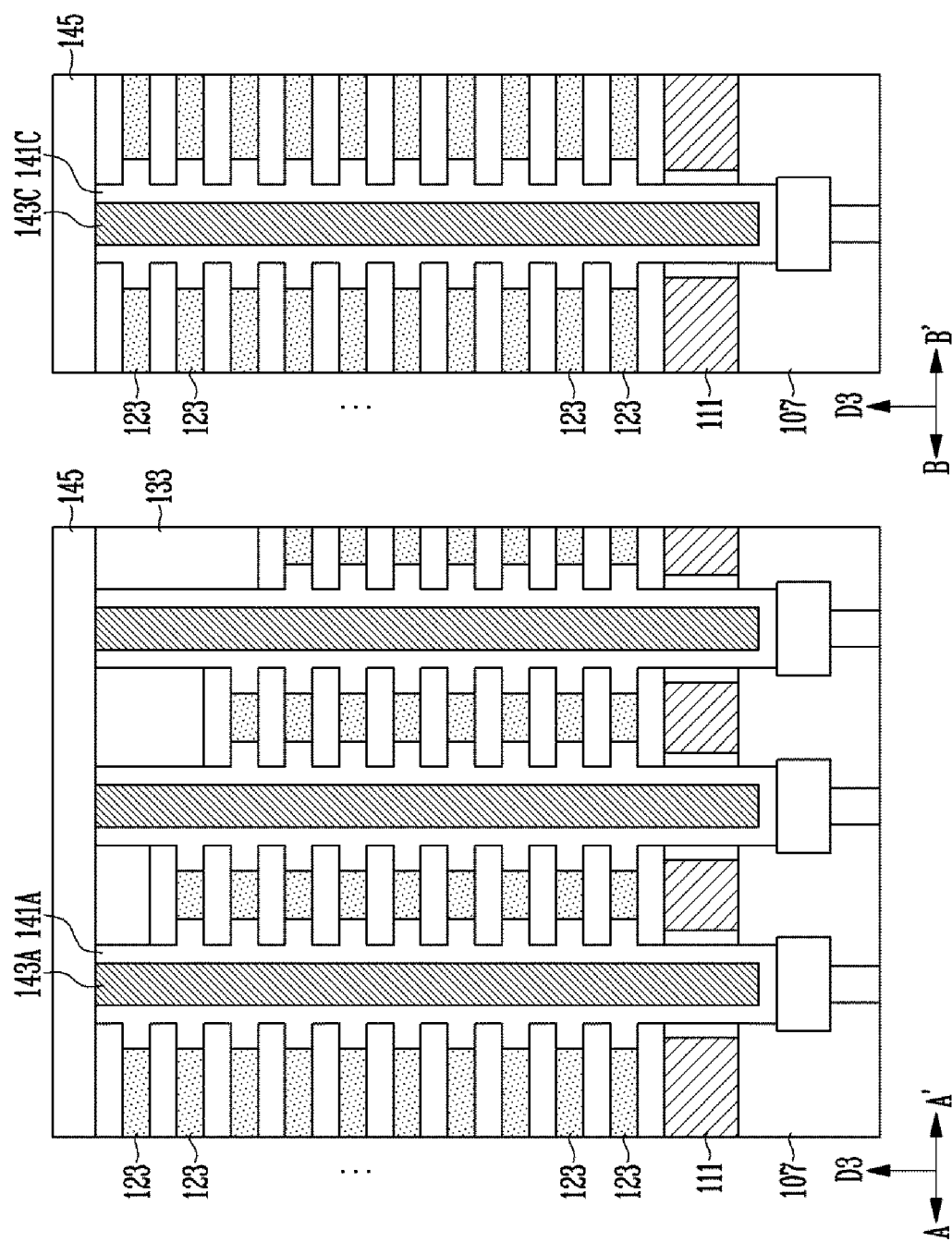

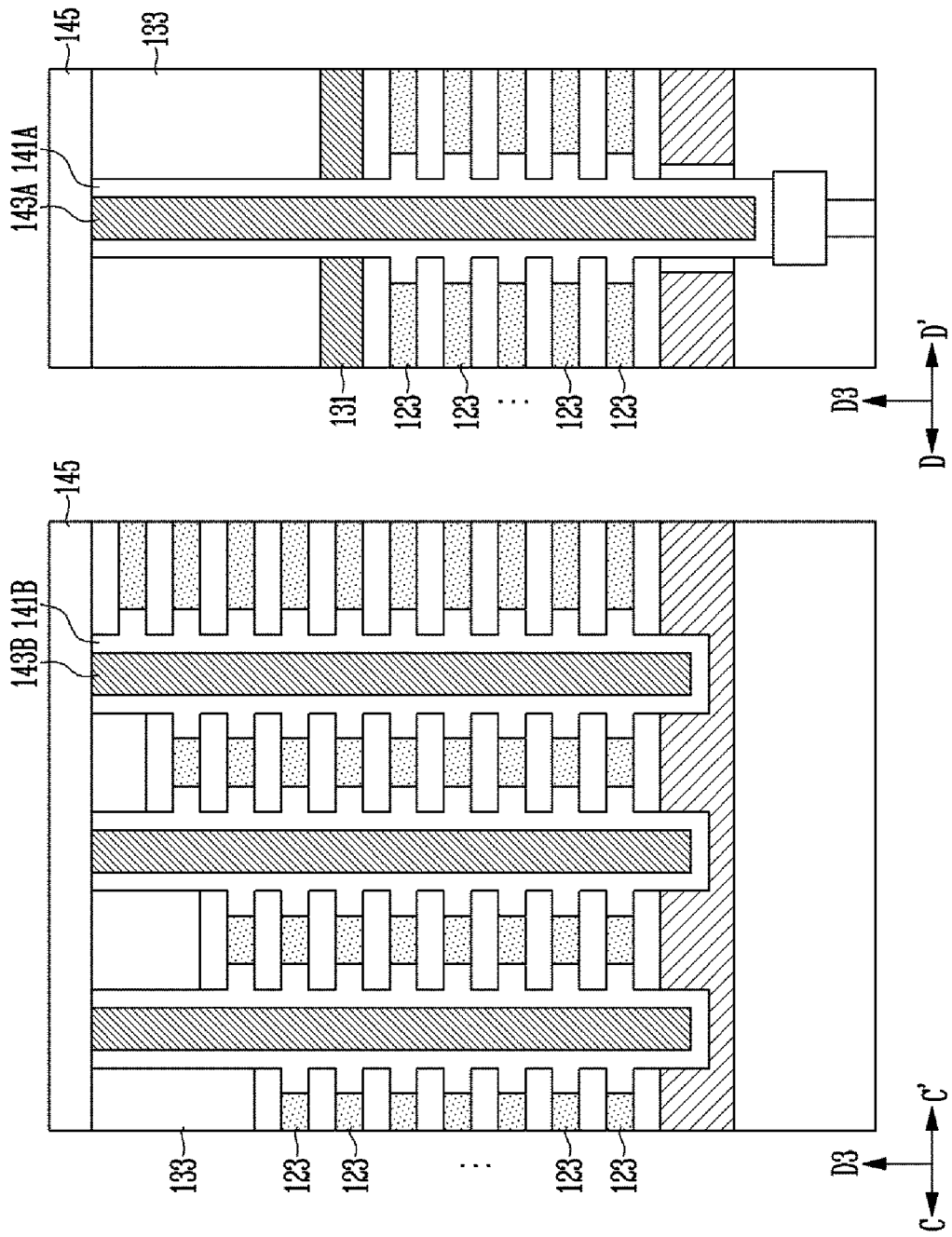

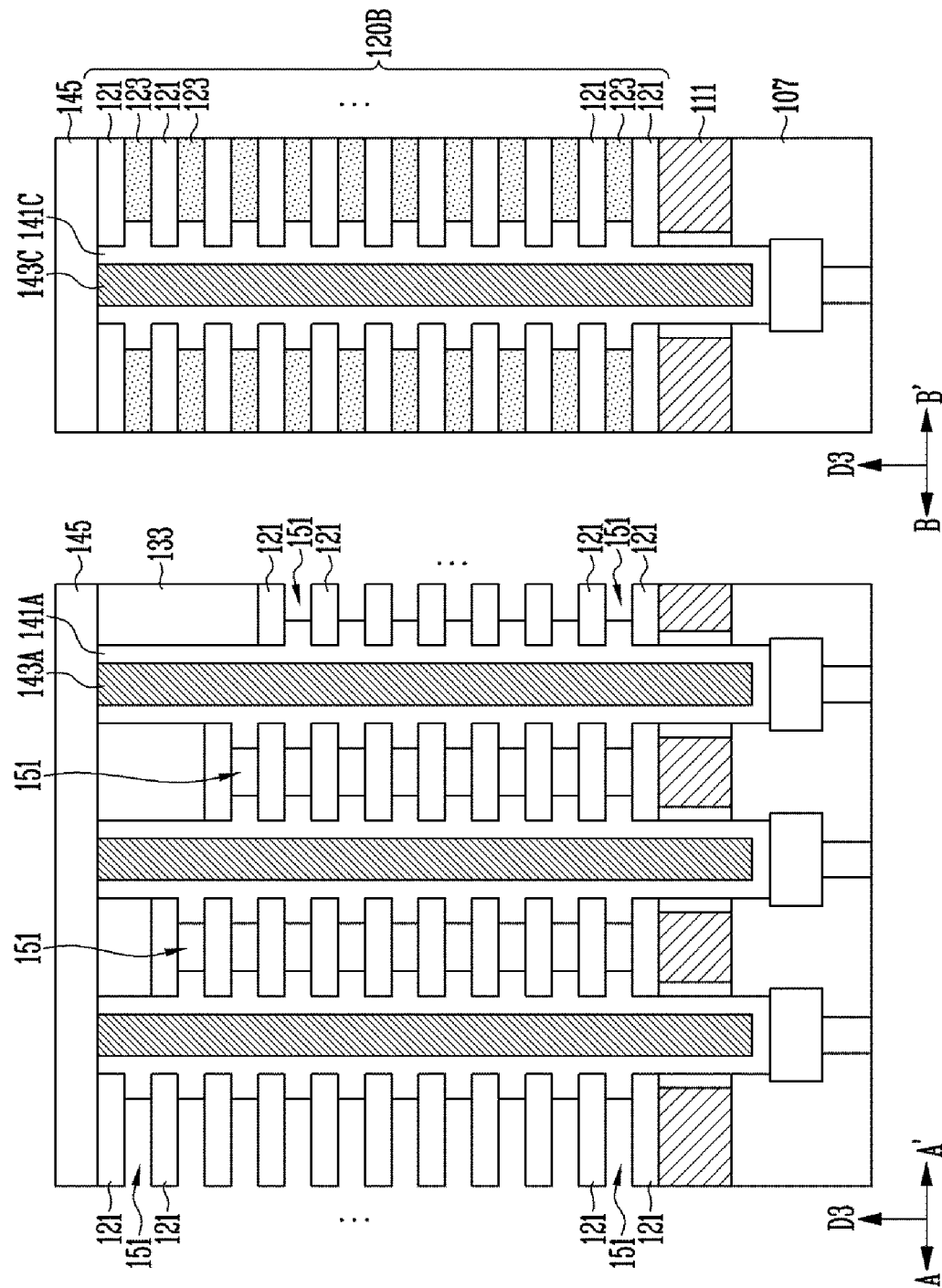

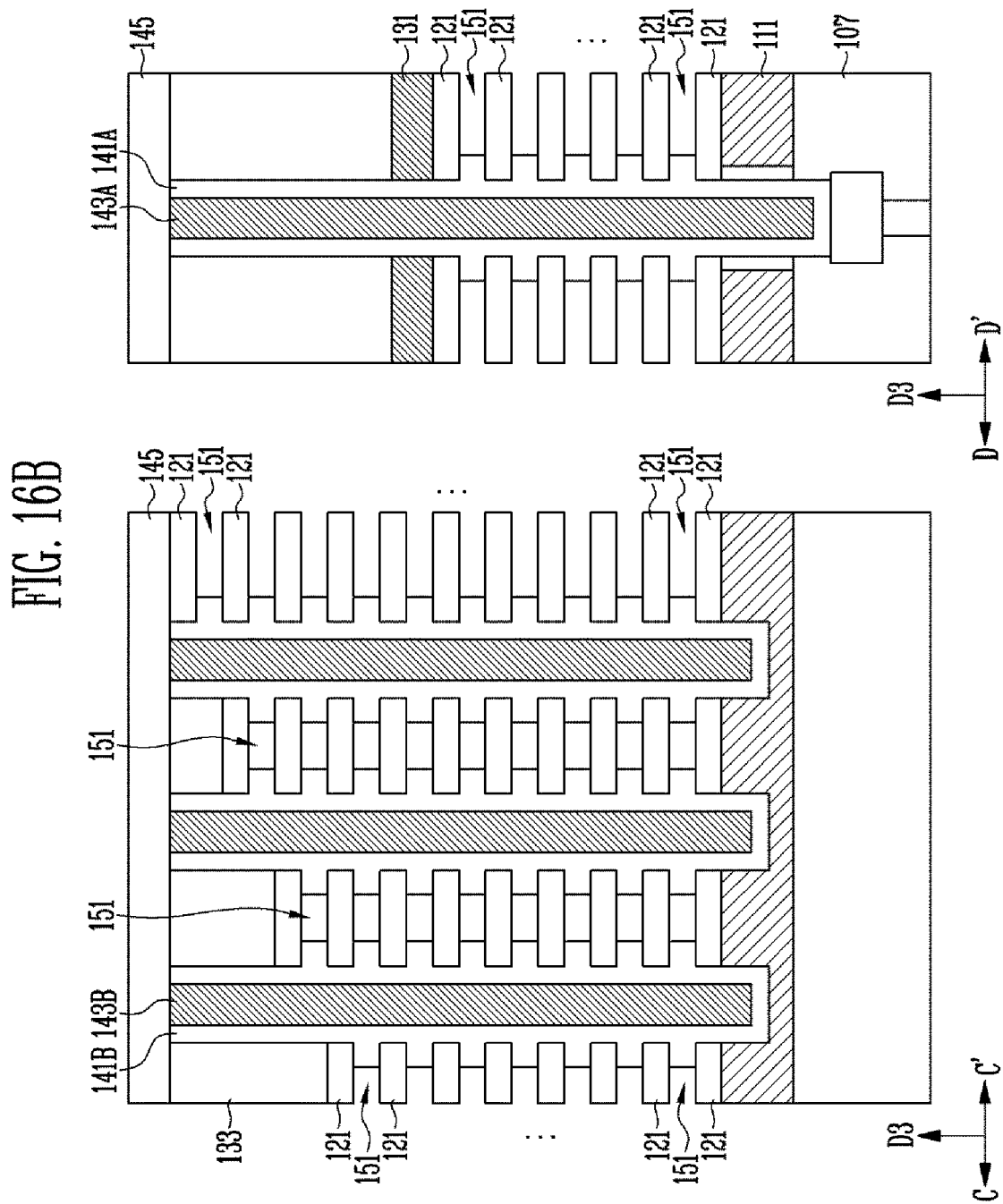

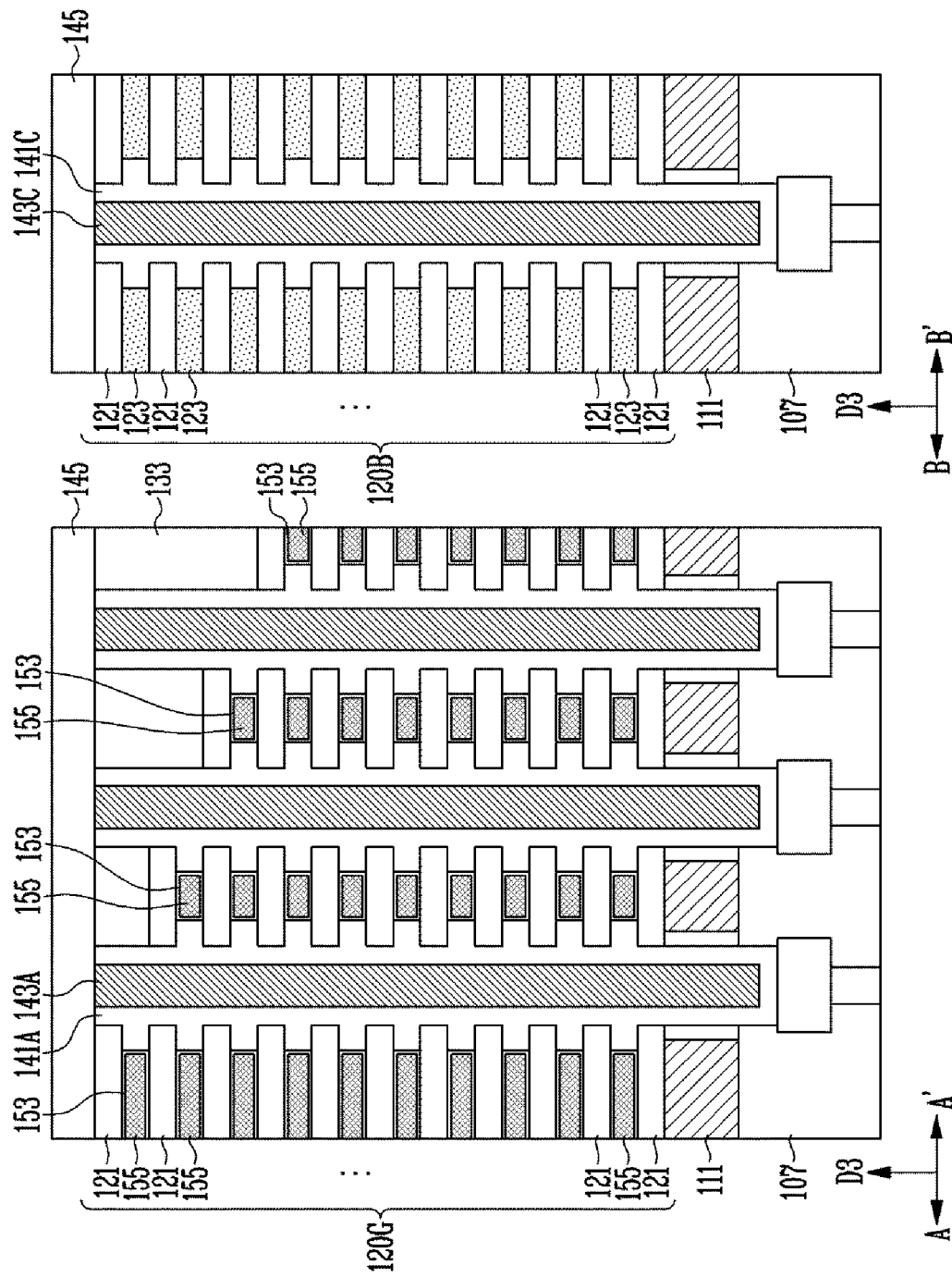

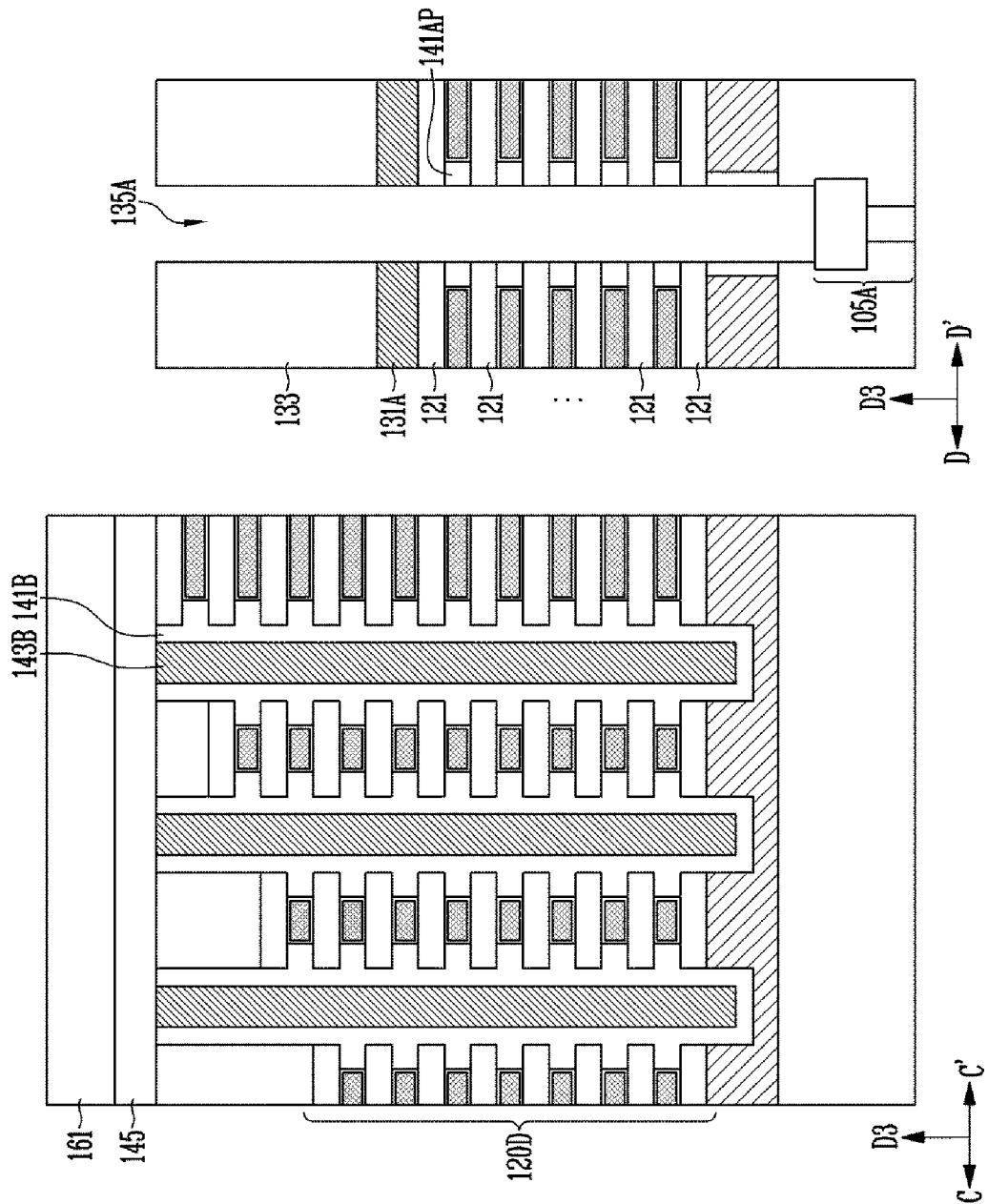

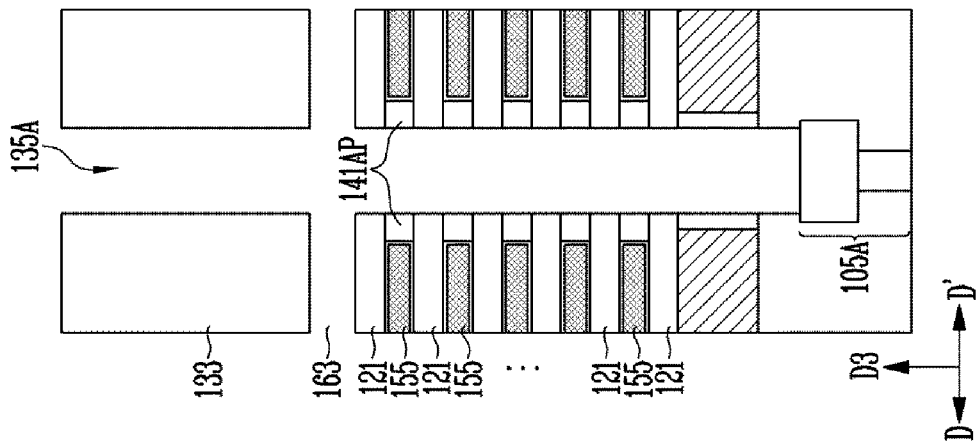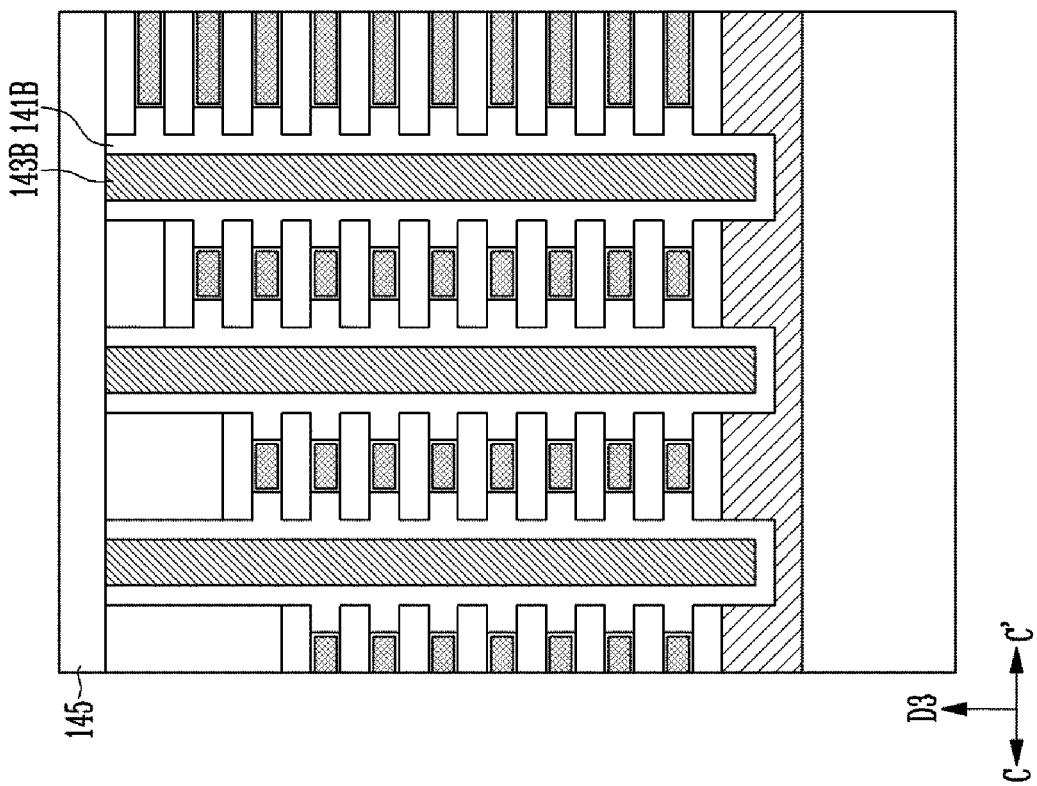
FIG. 19B

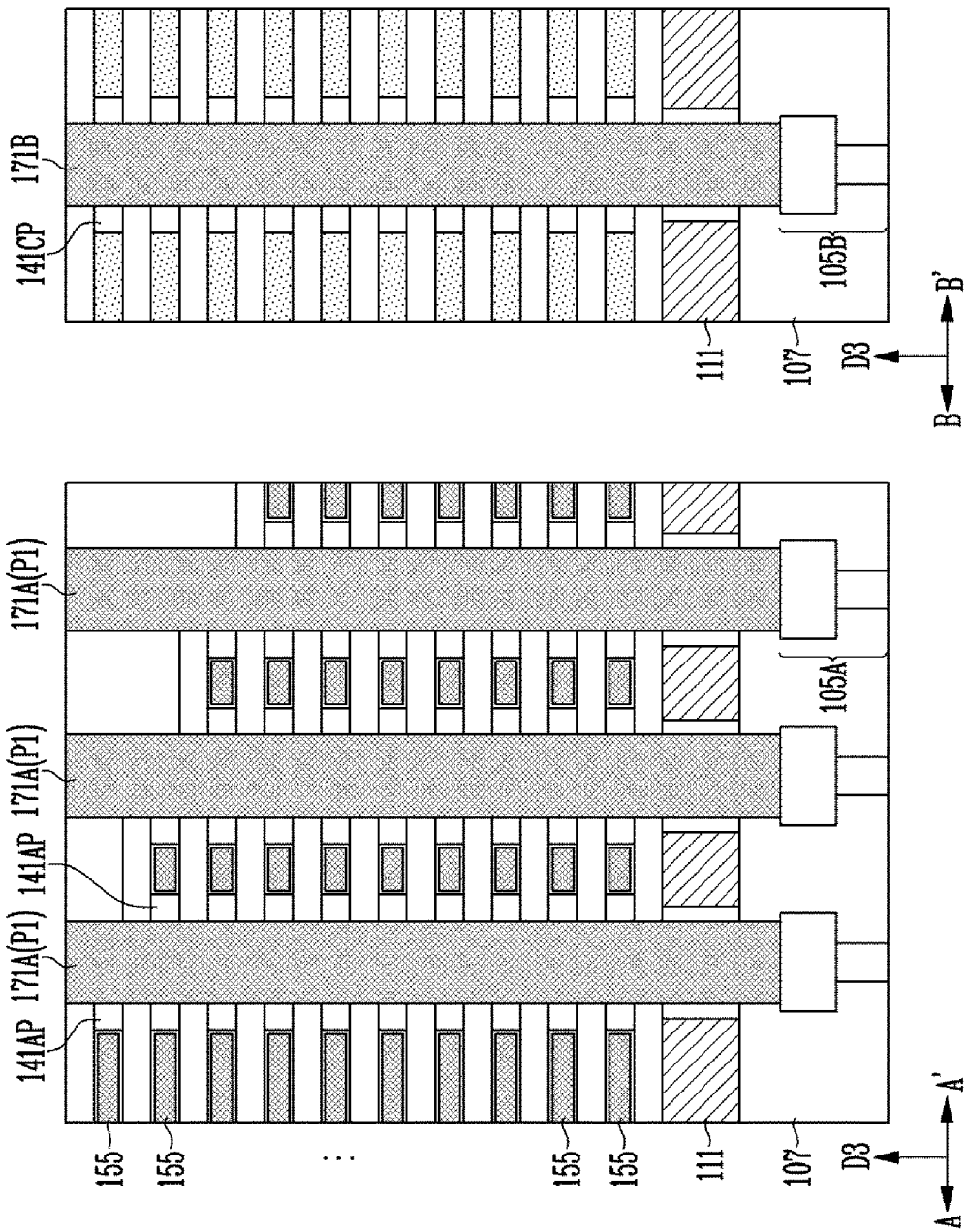

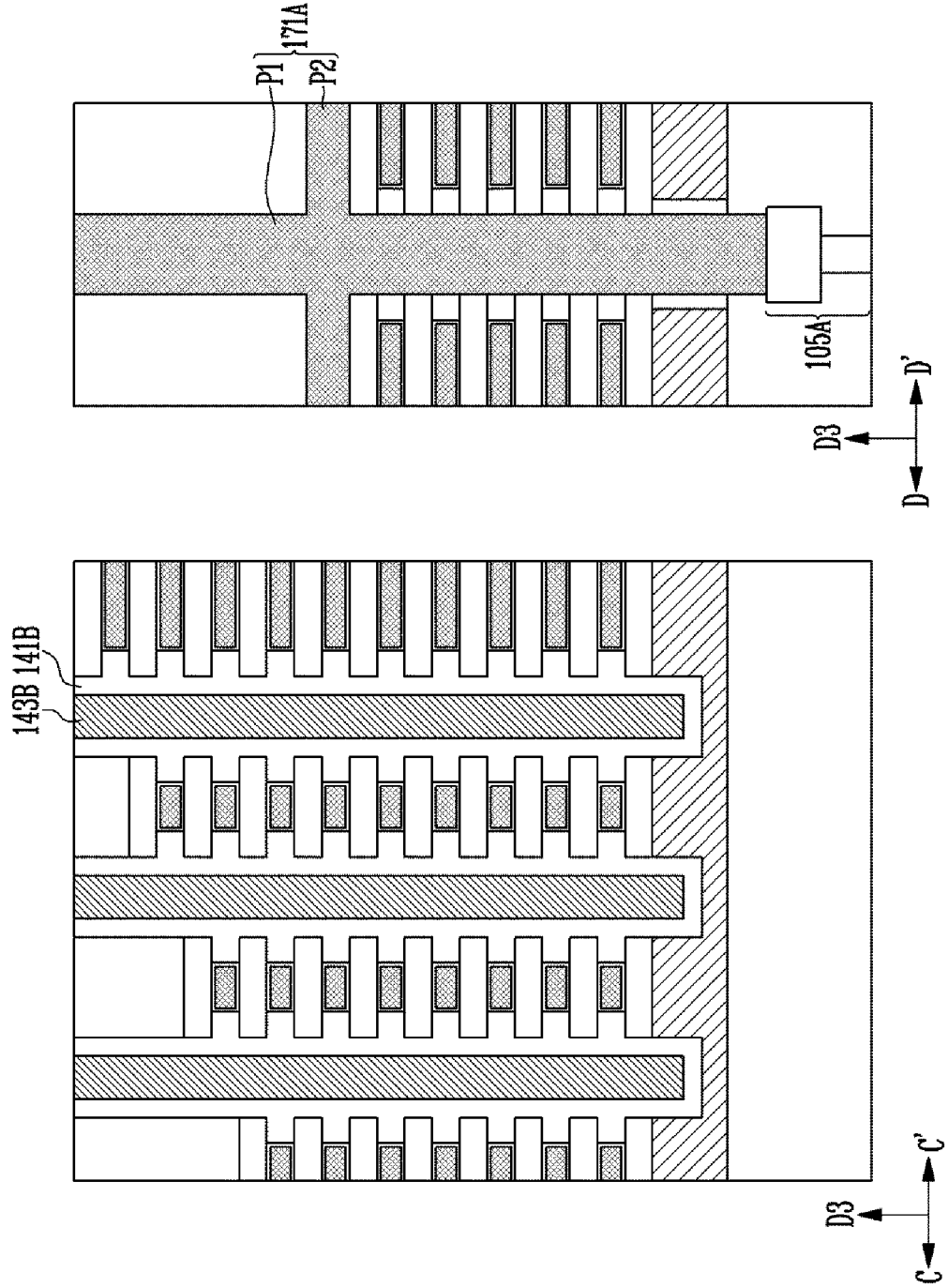

MANUFACTURING METHOD OF FORMING A SEMICONDUCTOR MEMORY DEVICE WITH IMPROVED STRUCTURAL STABILITY AND PROCESS DEFECTS

CROSS-REFERENCE TO RELATED APPLICATION

The present application is a continuation application of U.S. patent application Ser. No. 16/884,599, filed on May 27, 2020, and claims priority under 35 U.S.C. § 119(a) to Korean patent application number 10-2019-0161844, filed on Dec. 6, 2019, in the Korean Intellectual Property Office, the entire disclosure of which is incorporated herein by reference.

BACKGROUND

1. Technical Field

Various embodiments of the present disclosure generally relate to a semiconductor memory device and a method of manufacturing the semiconductor memory device, and more particularly, to a semiconductor memory device including a stack of conductive patterns and a method of manufacturing the semiconductor memory device.

2. Related Art

A semiconductor memory device includes a memory cell array and a peripheral circuit coupled to the memory cell array. The memory cell array includes multiple memory cells that may store data, and the peripheral circuit is configured to perform various operations of the memory cells.

The memory cell array may include memory cells which are stacked on a substrate. Gate electrodes of the memory cells may be implemented through conductive patterns that are stacked while being spaced apart from each other in the direction of stacking the memory cells. In forming a connection structure for connecting a stacking structure of the conductive patterns to the peripheral circuit, various process defects may occur.

SUMMARY

An embodiment of the present disclosure may provide for a semiconductor memory device, including a contact pattern including a vertical contact part and a sidewall contact part extending from the vertical contact part in a direction crossing the vertical contact part, a lower conductive pattern having a hole into which the vertical contact part is inserted, and an upper conductive pattern overlapping a portion of the lower conductive pattern, wherein the upper conductive pattern may include a first side portion in contact with the sidewall contact part, and a second side portion facing the vertical contact part and spaced apart from the vertical contact part.

An embodiment of the present disclosure may provide for a semiconductor memory device, including a gate stack having conductive patterns that are stacked while being spaced apart from each other in a stacking direction and form a stepped structure, sidewall contact parts formed on sidewalls of the conductive patterns, respectively, vertical contact parts extending in the stacking direction from the sidewall contact parts, respectively, and spacer insulating layers disposed between the vertical contact parts and the conductive patterns.

An embodiment of the present disclosure may provide for a method of manufacturing a semiconductor memory device, including forming a preliminary stepped structure including interlayer insulating layers and horizontal sacrificial layers that are alternately stacked, forming a pad sacrificial layer on a sidewall of each of the horizontal sacrificial layers, forming a first hole passing through the pad sacrificial layer and the preliminary stepped structure, forming a spacer insulating layer on a sidewall of the first hole, forming a first sacrificial pillar on the spacer insulating layer to fill the first hole, replacing the horizontal sacrificial layers with conductive patterns, removing the first sacrificial pillar to expose the spacer insulating layer, removing a portion of the spacer insulating layer to expose the pad sacrificial layer, removing the pad sacrificial layer, and forming a contact pattern that fills an area from which the pad sacrificial layer is removed and the first hole.

BRIEF DESCRIPTION OF THE DRAWINGS

FIGS. 10A, 10B, 11, 12A, 12B, 13A, 13B, 13C, 14A, 14B, 14C, 15A, 15B, 16A, 16B, 17A, 17B, 17C, 18A, 18B, 19A, 19B, 19C, and 20A, 20B, 20C are diagrams illustrating a method of manufacturing a semiconductor memory device in accordance with an embodiment.

DETAILED DESCRIPTION

The specific structural or functional descriptions disclosed herein are merely illustrative for the purpose of describing embodiments according to the concept of the present disclosure. The embodiments according to the concept of the present disclosure may be implemented in various forms, and should not be construed as limited to the embodiments set forth herein.

Various embodiments of the present disclosure are directed to a semiconductor memory device and a method of manufacturing the same, capable of improving process defects and increasing structural stability.

Figure 1:
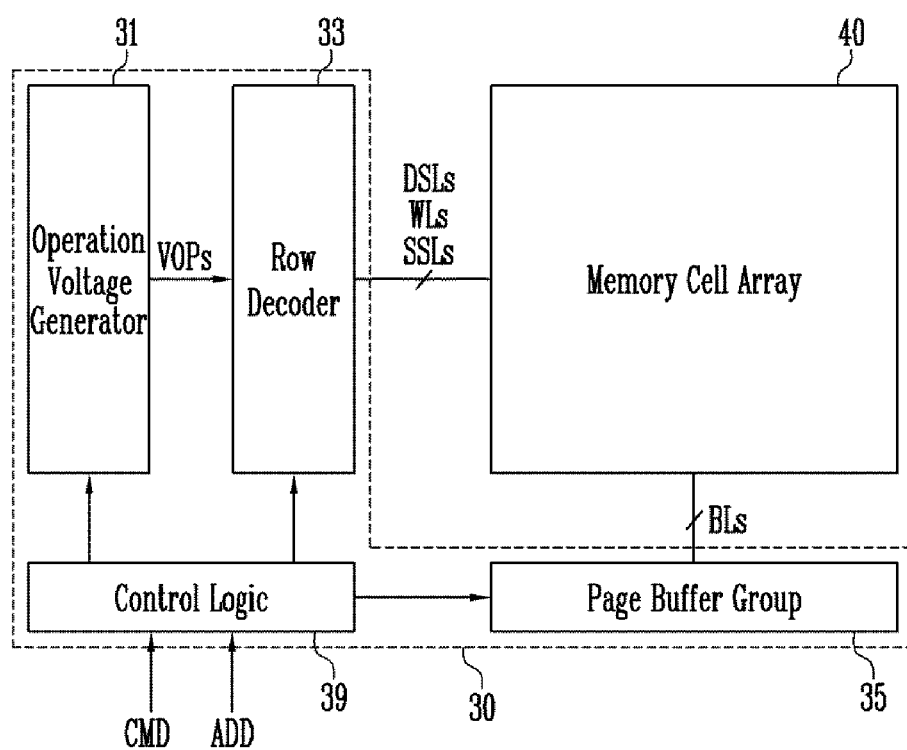
FIG. 1 is a block diagram illustrating a semiconductor memory device in accordance with an embodiment of the present disclosure.

FIG. 1 is a block diagram illustrating a semiconductor memory device 10 in accordance with an embodiment of the present disclosure.

Referring to FIG. 1, the semiconductor memory device 10 may include a peripheral circuit 30 and a memory cell array 40.

The peripheral circuit 30 may be configured to perform a program operation for storing data in the memory cell array 40, a read operation for outputting the data stored in the memory cell array 40, or an erase operation for erasing the data stored in the memory cell array 40. As an embodiment, the peripheral circuit 30 may include a control logic 39, an operation voltage generator 31, a row decoder 33, and a page buffer group 35.

The memory cell array 40 may include a plurality of memory blocks. Each of the memory blocks may be coupled to one or more drain select lines DSLs, a plurality of word lines WLs, one or more source select lines SSLs, and a plurality of bit lines BLs.

The control circuit 39 may control the peripheral circuit 30 in response to a command CMD and an address ADD.

The operation voltage generator 31 may generate various operation voltages VOPs used in the program operation, the read operation, and the erase operation in response to the control of the control logic 39. The operation voltages VOPs may include a program voltage, a verification voltage, a pass voltage, a select line voltage, etc.

The row decoder 33 may select a memory block in response to the control of the control logic 39. The row decoder 33 may be configured to apply the operation voltages VOPs to the drain select lines DSLs, the word lines WLs, and the source select lines SSLs coupled to the selected memory block.

The page buffer group 35 may be coupled to the memory cell array 40 through the bit lines BLs. The page buffer group 35 may temporarily store data received from an input/output circuit (not shown) during the program operation in response to the control of the control logic 39. The page buffer group 35 may sense the voltage or current of the bit lines BLs during the read operation or the verification operation in response to the control of the control logic 39.

Figure 2A:
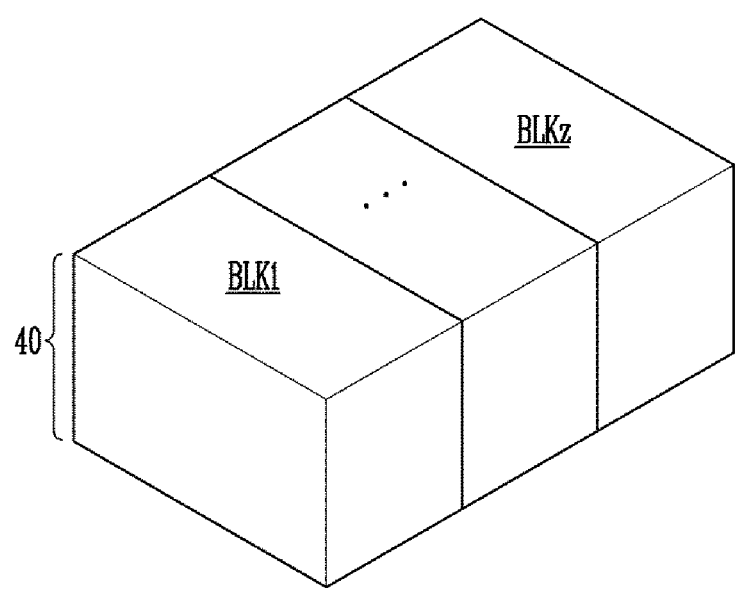
FIGS. 2A and 2B are diagrams illustrating an embodiment of a memory cell array shown in FIG. 1.
Figure 2B:
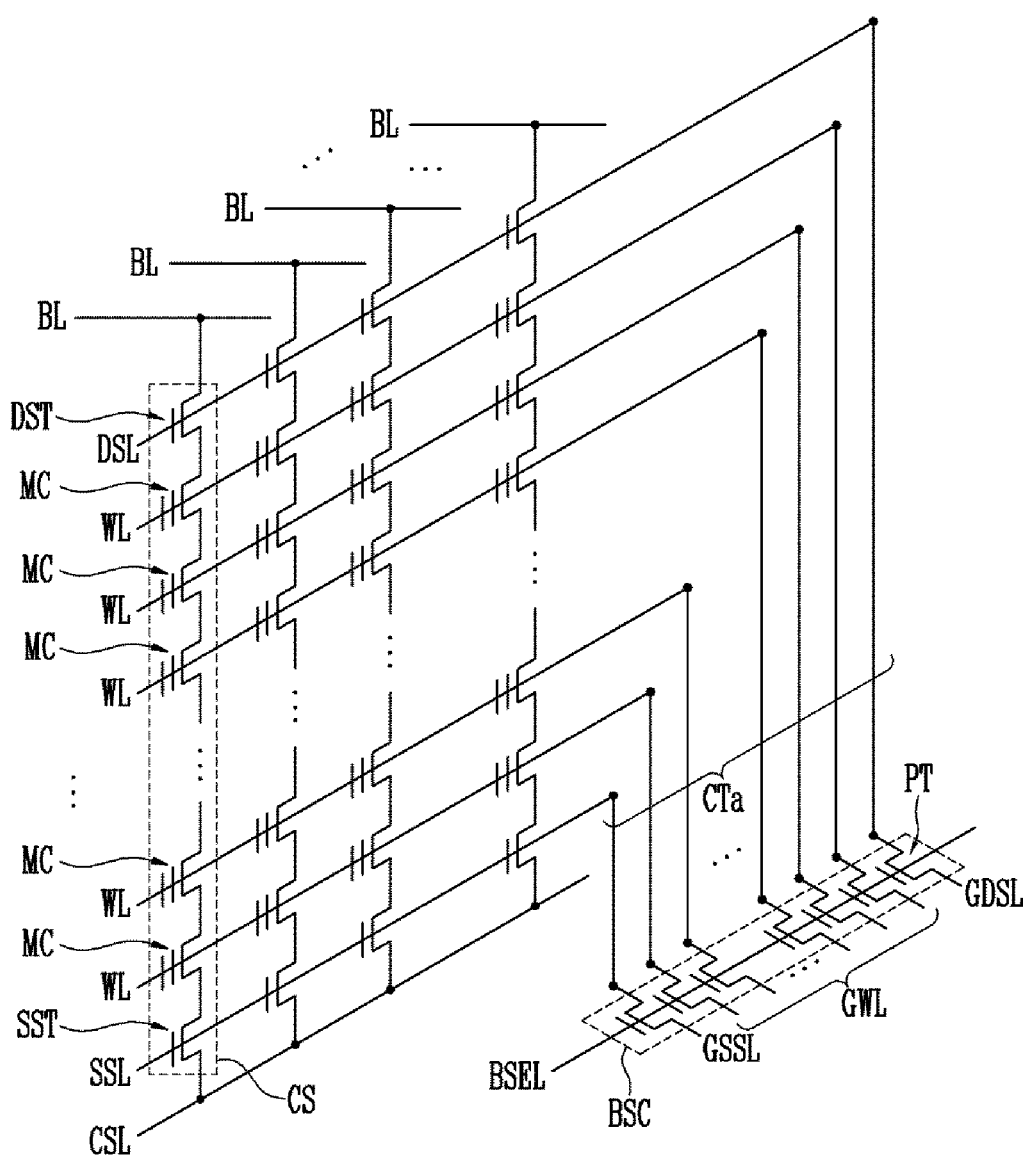

FIGS. 2A and 2B are diagrams illustrating an embodiment of the memory cell array 40 shown in FIG. 1.

FIG. 2A is a block diagram illustrating the schematic configuration of the memory cell array 40.

Referring to FIG. 2A, the memory cell array 40 may include a plurality of memory blocks BLK1 to BLKz. Each of the memory blocks BLK1 to BLKz may include a plurality of memory cell strings.

FIG. 2B is a circuit diagram showing an embodiment of the memory cell strings CS.

Referring to FIG. 2B, the memory cell strings CS may be arranged in multiple rows and multiple columns to form the corresponding memory blocks. For the convenience of recognition, FIG. 2B illustrates the memory cell strings CS forming one of the multiple rows.

The memory cell strings CS forming each row may be coupled to the bit lines BL, respectively. The memory cell strings CS arranged in multiple rows and multiple columns may be coupled to a common source line CSL.

Each of the memory cell strings CS may include a source select transistor SST, multiple memory cells MC, and a drain select transistor DS, which are stacked between the common source line CSL and the corresponding bit line BL.

The source select transistor SST may control an electric connection between the corresponding memory cell string CS and the common source line CSL. The drain select transistor DST may control an electric connection between the corresponding memory cell string CS and the corresponding bit line BL.

One source select transistor SST or two or more source select transistors SST coupled in series may be disposed between the common source line CSL and the multiple memory cells MC. One drain select transistor DST or two or more drain select transistors DST coupled in series may be disposed between the bit line BL and the multiple memory cells MC.

The multiple memory cells MC may be coupled to the word lines WL, respectively. The operation of the multiple memory cells MC may be controlled by cell gate signals applied to the word lines WL. The source select transistor SST may be coupled to the source select line SSL. The operation of the source select transistor SST may be controlled by a source select gate signal applied to the source select line SSL. The drain select transistor DST may be coupled to the drain select line DSL. The operation of the drain select transistor DST may be controlled by a drain select gate signal applied to the drain select line DSL.

The word lines WL may be disposed between the source select line SSL and the drain select line DSL to be spaced apart from each other. Each of the source select line SSL, the drain select line DSL, and the word lines WL may extend in the row direction to control the multiple columns of memory cell strings CS.

The source select line SSL, the drain select line DSL, and the word lines WL may be implemented by the conductive patterns that are stacked while being spaced apart from each other. The conductive patterns are stacked alternately with interlayer insulating layers to form a gate stack. The source select transistor SST, the memory cells MC, and the drain select transistor DST of each of the memory cell strings CS may be coupled in series through a channel structure passing through the gate stack.

The source select line SSL, the drain select line DSL, and the word lines WL may be coupled to a block select circuit BSC. The block select circuit BSC may form a portion of the row decoder 33 described with reference to FIG. 1. The block select circuit BSC according to an embodiment may include pass transistors PT coupled to the source select line SSL, the drain select line DSL, and the word lines WL, respectively. Gates of the pass transistors PT may be coupled to a block select line BSEL. The pass transistors PT may be configured to transmit voltages applied to global lines GSSL, GWL, and GDSL to the source select line SSL, the drain select line DSL, and the word lines WL in response to a block select signal applied to the block select line BSEL.

The block select circuit BSC may be coupled to conductive patterns forming the source select line SSL, the drain select line DSL, and the word lines WL via contact patterns CTa. The contact patterns CTa may pass through a gate stack to be electrically coupled to the block select circuit BSC.

Figure 3:
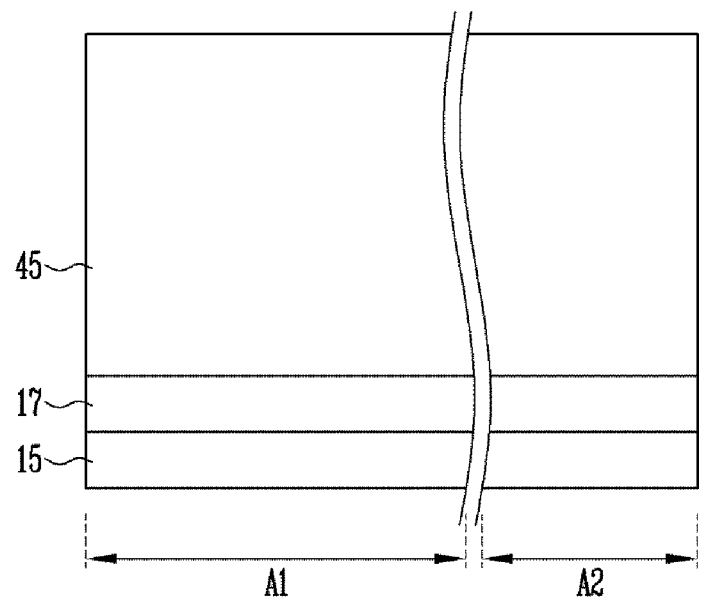
FIG. 3 is a block diagram schematically illustrating a substrate including a peripheral circuit shown in FIG. 1 and components overlapping the substrate.

FIG. 3 is a block diagram schematically illustrating a substrate 15 including the peripheral circuit 30 shown in FIG. 1, and components 17 and 45 overlapping the substrate 15.

Referring to FIG. 3, the substrate 15 may include a single-crystal semiconductor layer and various circuits forming the peripheral circuit 30 described with reference to FIG. 1. The single-crystal semiconductor layer may be a bulk silicon substrate, a silicon-on-insulator substrate, a germanium substrate, a germanium-on-insulator substrate, a silicon-germanium substrate, or an epitaxial layer formed by a selective epitaxial growth method. The peripheral circuit 30 described with reference to FIG. 1 may be formed on the single-crystal semiconductor layer.

The substrate 15 may include a first area A1 and a second area A2. In an embodiment, the block select circuit BSC described with reference to FIG. 2B may be disposed in the first area A1 of the substrate 15.

An interconnection array 17 may be disposed on the first area A1 and the second area A2 of the substrate 15. The interconnection array 17 may include multiple interconnection structures embedded into a lower insulating structure. The interconnection structures may interconnect the memory cell array 40 and the peripheral circuit 30 described with reference to FIG. 1, or interconnect upper wires (not shown) disposed on the memory cell array 40 and the peripheral circuit 30.

The stack array 45 may be disposed on the interconnection array 17. The stack array 45 may include gate stacks, a dummy stepped structure, and a dummy buffer stack.

Figure 4:
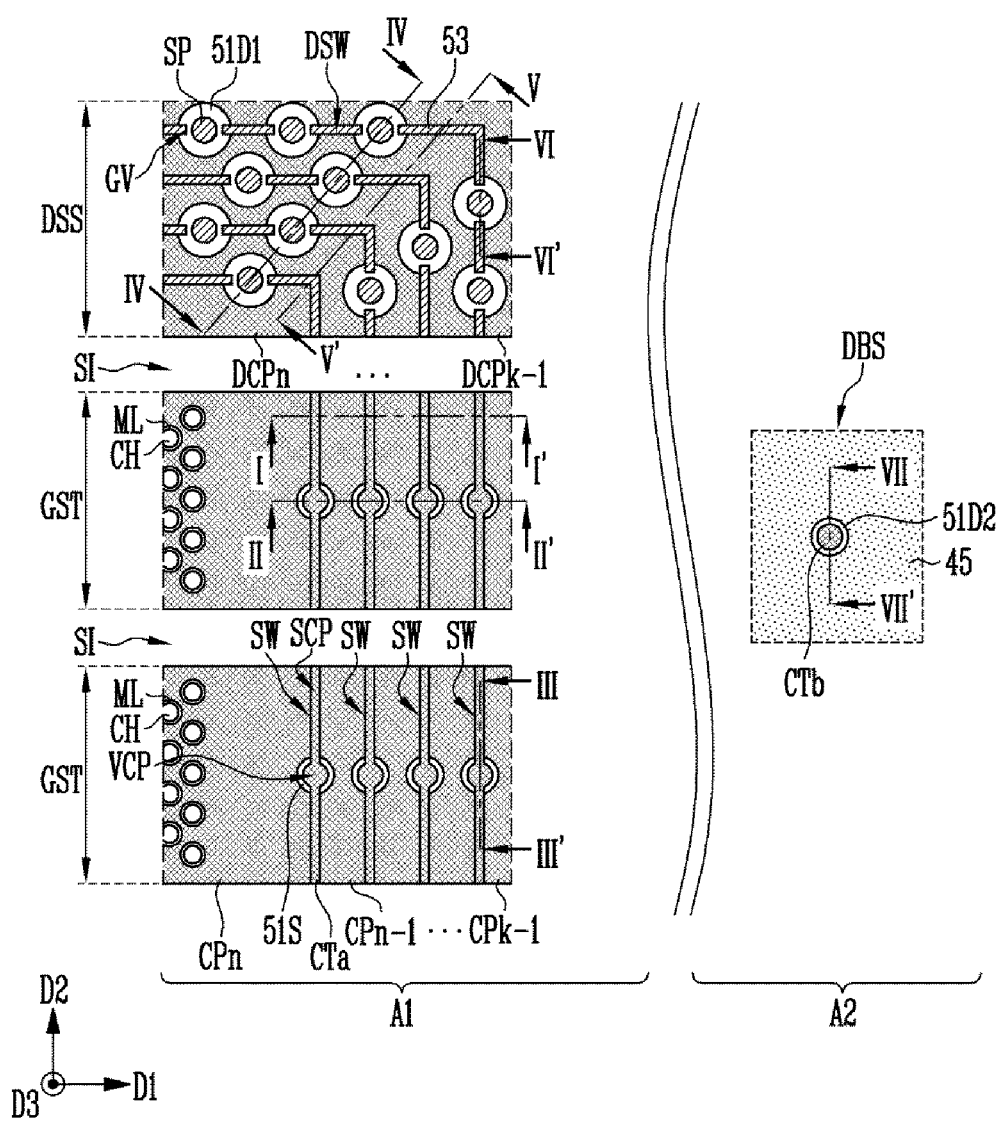
FIG. 4 is a plan view illustrating a stack array in accordance with an embodiment.

FIG. 4 is a plan view illustrating the stack array 45 in accordance with an embodiment.

Referring to FIG. 4, the stack array 45 may include gate stacks GST overlapping the first area A1, the dummy stepped structure DSS, and the dummy buffer stack DBS overlapping the second area A2.

The gate stacks GST and the dummy stepped structure DSS may be separated from each other by slits SI.

Figure 5A:
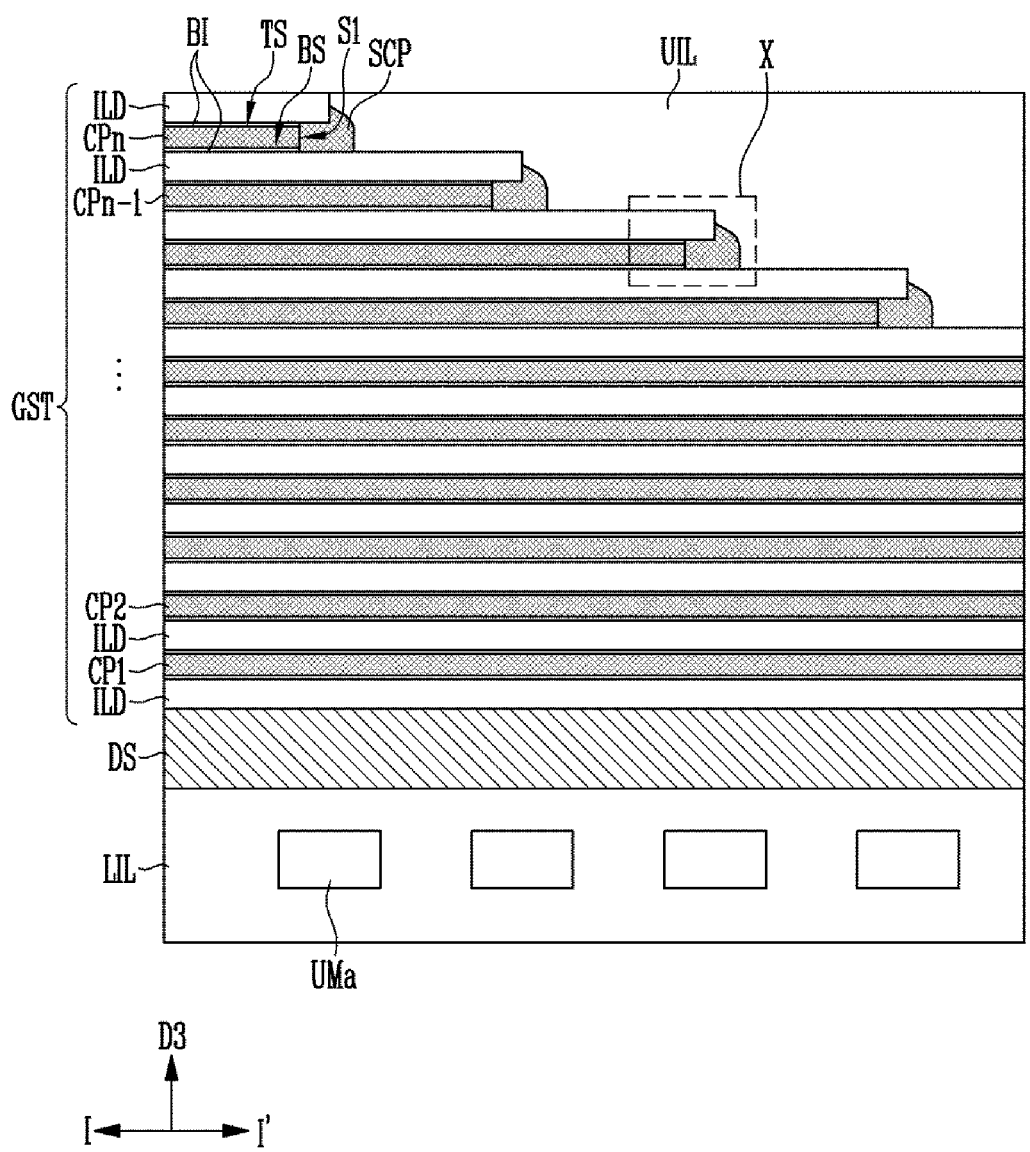
FIGS. 5A, 5B, 5C, 5D and 5E are sectional views of a gate stack shown in FIG. 4.

As illustrated in FIG. 5A, each of the gate stacks GST may include multiple conductive patterns CP1 to CPn (n is a natural number). For the convenience of recognition, FIG. 4 shows some conductive patterns CPk-1 to CPn (k is a natural number smaller than n) among the conductive patterns CP1 to CPn. Each of the conductive patterns CP1 to CPn may extend in a first direction D1 and a second direction D2. The first direction D1 and the second direction D2 may be directions in which X and Y axes crossing each other in an XYZ coordinate system are directed. The conductive patterns CP1 to CPn may be stacked while being spaced apart from each other in a third direction D3. The third direction D3 may be a direction in which a Z axis is directed in the XYZ coordinate system. The conductive patterns CP1 to CPn may form a step structure.

Sidewalls SW of the conductive patterns CP1 to CPn may be in contact with contact patterns CTa, respectively. Each of the contact patterns CTa may include a vertical contact part VCP and a sidewall contact part SCP. The sidewall contact part SCP may be disposed on the sidewall SW of the corresponding conductive pattern, and the vertical contact part VCP may extend from the corresponding sidewall contact part SCP in the third direction D3. The vertical contact parts VCP of the contact patterns CTa may be spaced apart from the conductive patterns CP1 to CPn by spacer insulating layers 51S. Each of the sidewall contact parts SCP of the contact patterns CTa may extend from the corresponding vertical contact part VCP, and may pass through the corresponding spacer insulating layer 51S to come into contact with the sidewall SW of the corresponding conductive pattern. As illustrated in FIG. 4, the vertical contact parts VCP passing through each gate stack GST may be arranged in a row in the first direction D1. However, the present disclosure is not limited thereto. For example, the vertical contact parts VCP passing through each gate stack GST may be arranged in a zigzag pattern.

Each of the gate stacks GST may be penetrated by multiple channel structures CH. The channel structures CH may extend in the third direction D3 to pass through the conductive patterns CP1 to CPb, in an area where the conductive patterns CP1 to CPn overlap each other. Each of the channel structures CH may be used as a channel area of the corresponding memory cell string. Each of the channel structures CH may be enclosed by a memory layer ML. The memory layer ML may be used as a data storage area of the corresponding memory cell.

As illustrated in FIG. 4, the channel structures CH passing through each gate stack GST may be arranged in a zigzag pattern. However, the present disclosure is not limited thereto. For example, the channel structures CH passing through each gate stack GST may be arranged in a matrix structure in a plane extending in the first direction D1 and the second direction D2.

Figure 7A:
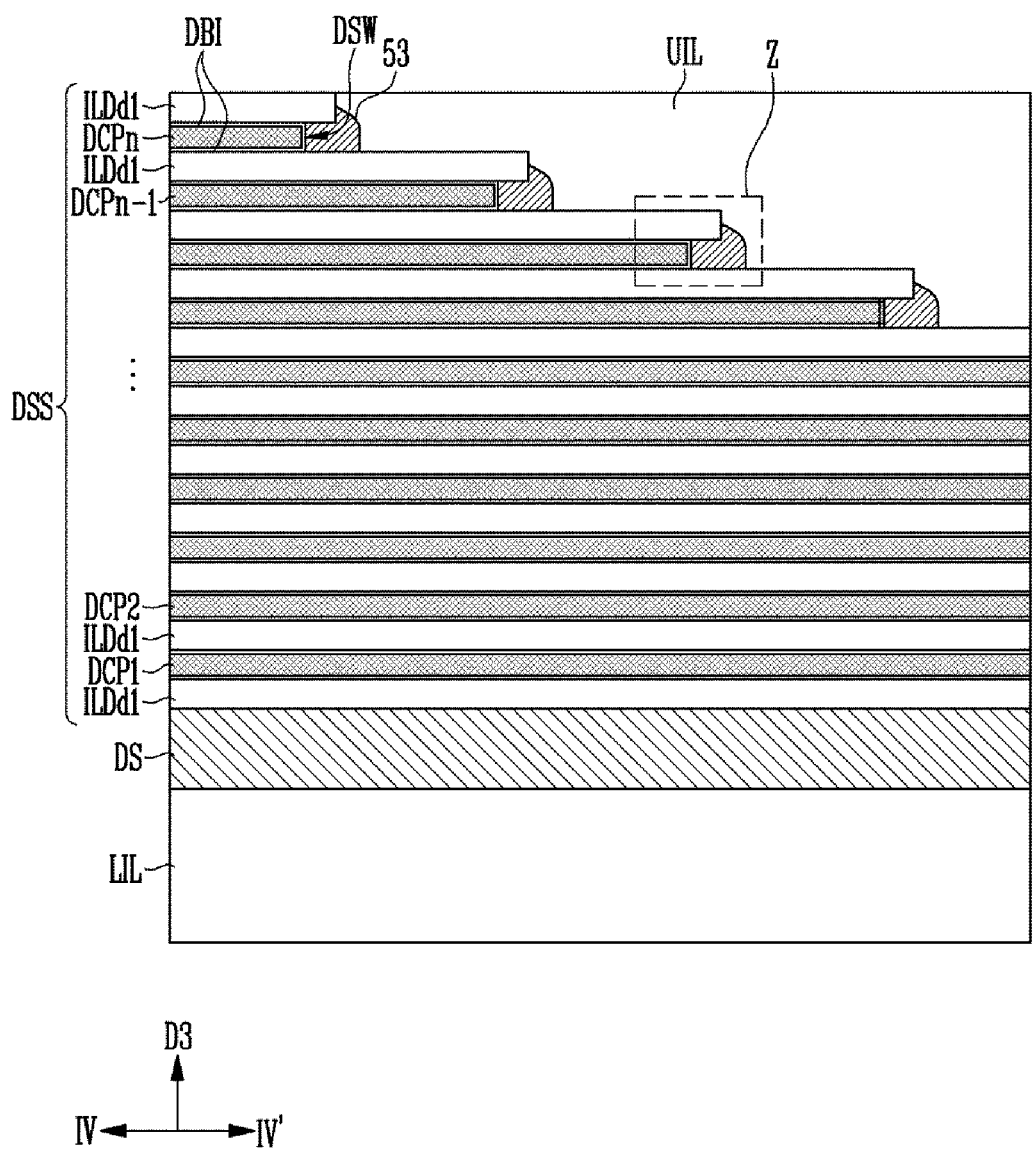
FIGS. 7A, 7B, 7C, and 7D are sectional views of a dummy stepped structure shown in FIG. 4.

As illustrated in FIG. 7A, the dummy stepped structure DSS may include multiple dummy conductive patterns DCP1 to DCPn. For the convenience of recognition, FIG. 4 illustrates some conductive patterns DCPk-1 to DCPn of the dummy conductive patterns DCP1 to DCPn.

Each of the dummy conductive patterns DCP1 to DCPn may extend in the first direction D1 and the second direction D2. The dummy conductive patterns DCP1 to DCPn may be stacked while being spaced apart from each other in the third direction D3. The dummy stepped structure DSS may be adjacent to any one of the gate stacks GST. The dummy conductive patterns DCP1 to DCPn may form steps of the dummy stepped structure DSS, and may be disposed on the same level as the conductive patterns CP1 to CPn.

Pad sacrificial layers 53 may be disposed on the steps of the dummy stepped structure DSS. The pad sacrificial layers 53 may be formed on sidewalls DSW of the dummy conductive patterns DCP1 to DCPn, respectively.

The dummy stepped structure DSS may be penetrated by support pillars SP extending in the third direction D3. The support pillars SP may be enclosed by first dummy spacer insulating layers 51D1, respectively. A groove GV may be formed on a sidewall of each of the first dummy spacer insulating layers 51D1 so that the corresponding pad sacrificial layer 53 is inserted into the groove GV (i.e., first groove). The support pillars SP may be insulated from the dummy conductive patterns DCP1 to DCPn by the first dummy spacer insulating layers 51D1. The support pillars SP may be insulated from the pad sacrificial layers 53 by the first dummy spacer insulating layers 51D1. The arrangement of the support pillars SP passing through the dummy stepped structure DSS may be variously changed without being limited to those illustrated in the drawings.

Figure 8:
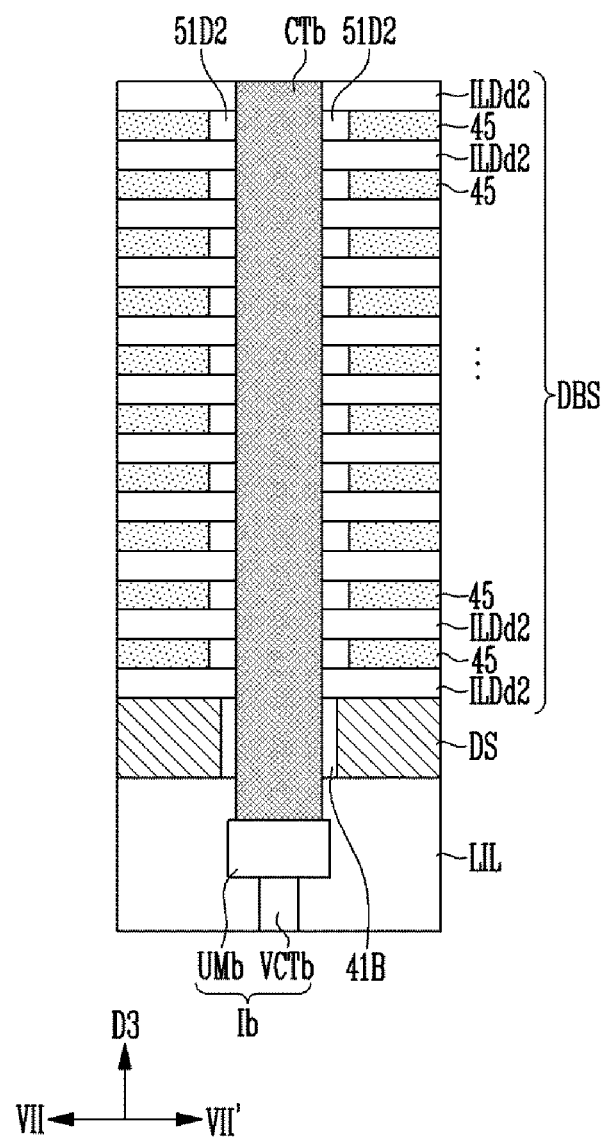
FIG. 8 is a sectional view of a dummy buffer stack shown in FIG. 4.

As illustrated in FIG. 8, the dummy buffer stack DBS may include multiple horizontal sacrificial layers 45 that are stacked while being spaced apart from each other in the third direction D3. For the convenience of recognition, FIG. 4 shows a portion of the dummy buffer stack DBS.

Each of the horizontal sacrificial layers 45 may extend in the first direction D1 and the second direction D2. The horizontal sacrificial layers 45 may be disposed on the same level as the conductive patterns CP1 to CPn.

The dummy buffer stack DBS may be penetrated by a contact plug CTb extending in the third direction D3. A second dummy spacer insulating layer 51D2 may be disposed between each of the horizontal sacrificial layers 45 and the contact plug CTb.

The dummy conductive patterns DCP1 to DCPn may be formed of the same conductive material as the conductive patterns CP1 to CPn.

A material forming the pad sacrificial layers 53 may be different from a material forming the horizontal sacrificial layers 45. In an embodiment, the horizontal sacrificial layers 45 may include a nitride layer, and the pad sacrificial layers 53 may include a material having higher etching resistance to phosphoric acid than the nitride layer. For example, the pad sacrificial layers 53 may include polysilicon, metal, TiN or SiCN.

The support pillars SP may be formed of a material different from materials forming the spacer insulating layers 51S and the first and second dummy spacer insulating layers 51D1 and 51D2. For example, the support pillars SP may include polysilicon, metal, TiN or SiCN. In an embodiment, the material forming the support pillars SP may be the same as the material forming the pad sacrificial layers 53.

The contact patterns CTa and the contact plug CTb may be formed of the same conductive material.

The memory layer ML may include a tunnel insulating layer, a data storage layer, and a cell blocking insulating layer, which are sequentially stacked from the sidewall of the channel structure CH towards the gate stack GST. The data storage layer may be formed of a material layer that may store data changed using Fowler-Nordheim tunneling. To this end, the data storage layer may be formed of various materials, for example, a nitride layer capable of trapping charges. The data storage layer may include silicon, phase-change material, nanodots, etc. without being limited to those described above. The cell blocking insulating layer may include an oxide layer capable of blocking charges. The tunnel insulating layer may be formed of a silicon oxide layer making charge tunneling possible.

Figure 5B:
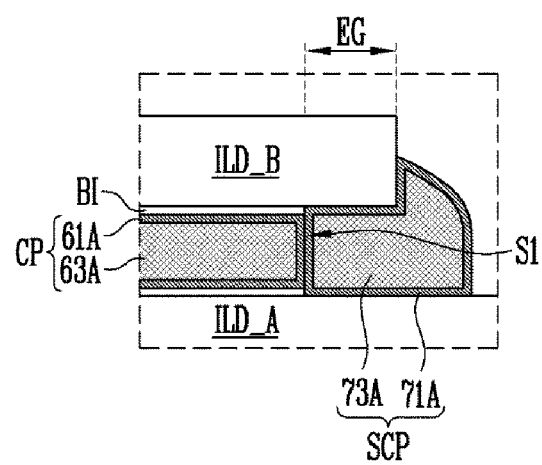
Figure 5C:
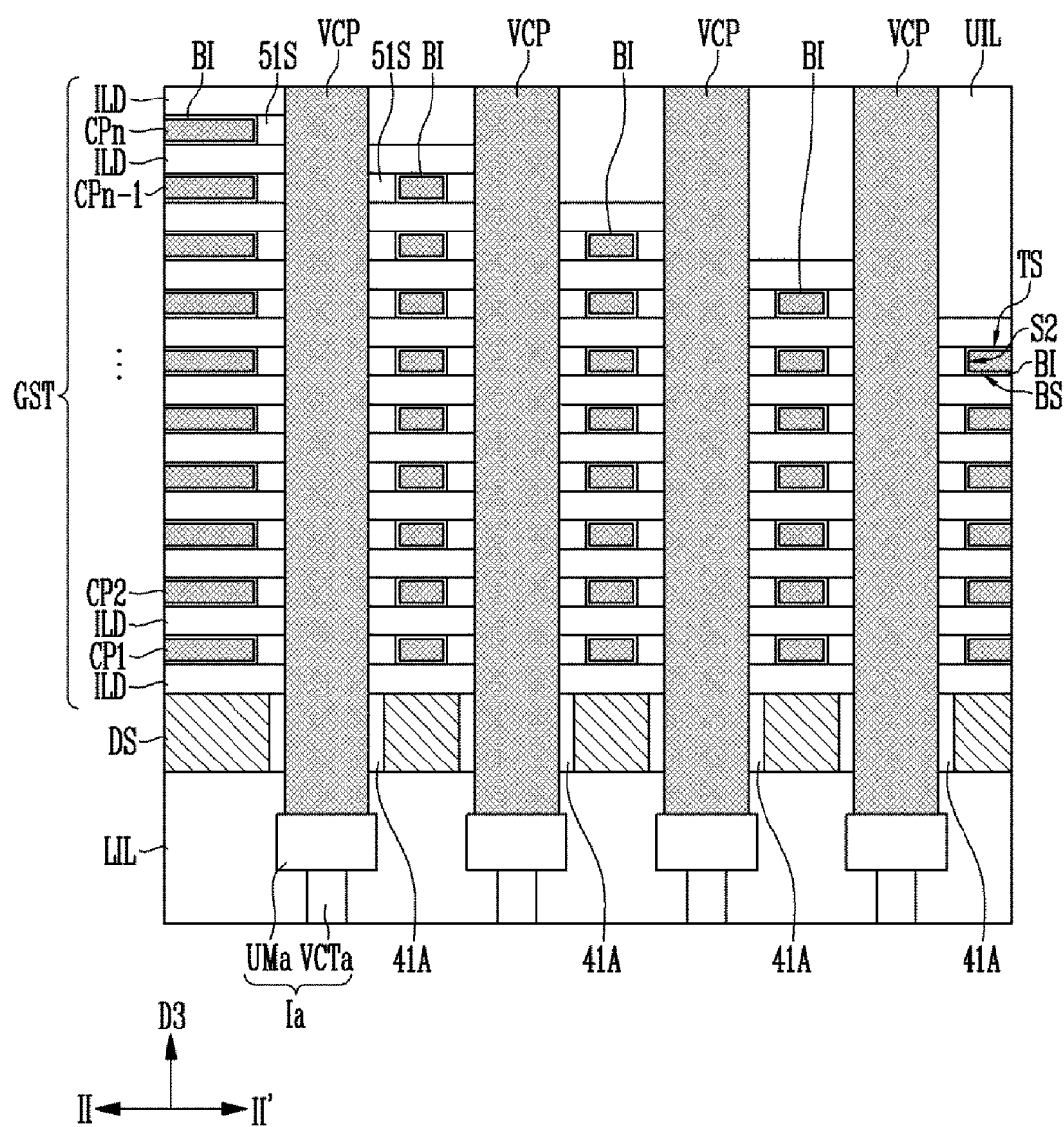
Figure 5D:
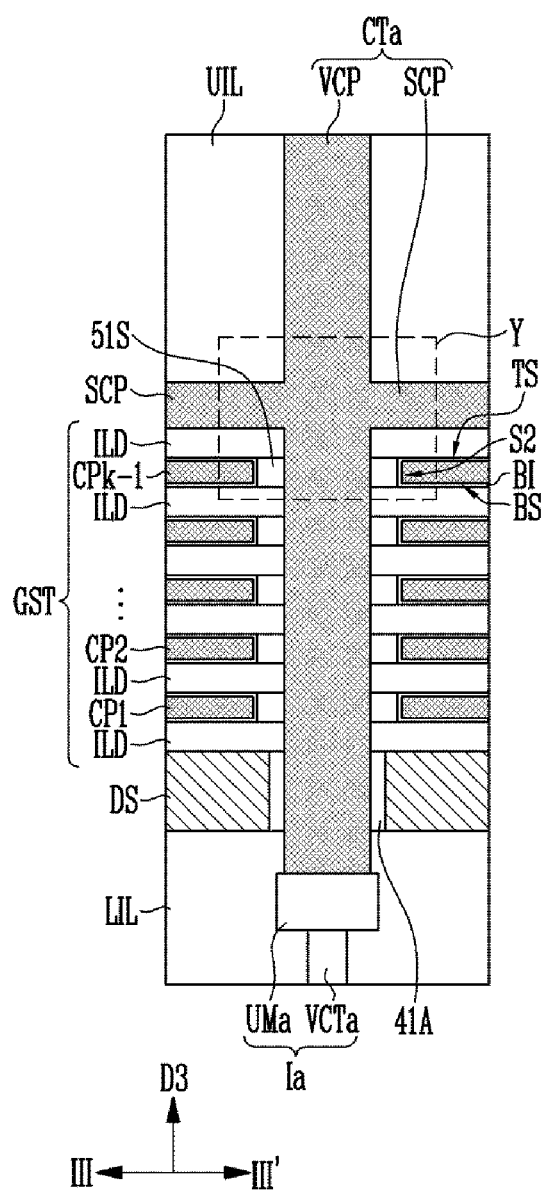
Figure 5E:
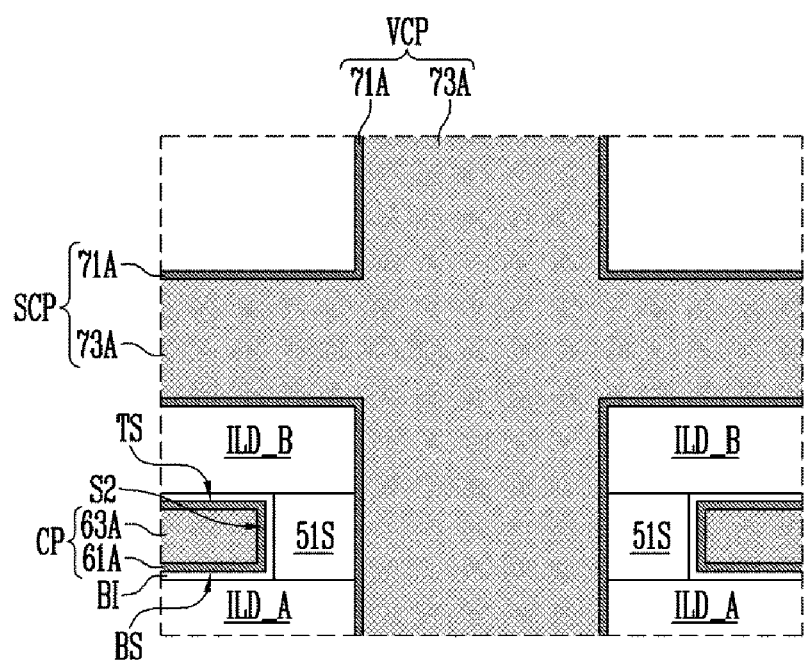

FIGS. 5A to 5E are sectional views of the gate stack GST shown in FIG. 4. FIG. 5A is a sectional view taken along line I-I' of FIG. 4, and FIG. 5B is an enlarged view of area X shown in FIG. 5A. FIG. 5C is a sectional view taken along line II-II' of FIG. 4. FIG. 5D is a sectional view taken along line III-III' of FIG. 4, and FIG. 5E is an enlarged view of area Y shown in FIG. 5D.

Referring to FIGS. 5A, 5C, and 5D, the gate stack GST may further include interlayer insulating layers ILD that are stacked while being spaced apart from each other in the third direction D3. The interlayer insulating layers ILD may be disposed alternately with the conductive patterns CP1 to CPn in the third direction D3. The gate stack GST may overlap first interconnection structures Ia of an interconnection array 17 described with reference to FIG. 3. The first interconnection structures Ia may be embedded into a lower insulating structure LIL. The lower insulating structure LIL and the first interconnection structures Ia may overlap the first area A1 of the substrate 15 described with reference to FIG. 3.

A doped semiconductor layer DS may be disposed between the lower insulating structure LIL and the gate stack GST. The doped semiconductor layer DS may be used as a common source line CSL described with reference to FIG. 2B. The doped semiconductor layer DS may include at least one of an n-type dopant and a p-type dopant. In an embodiment, the doped semiconductor layer DS may include an n-type doped silicon layer.

The doped semiconductor layer DS may be penetrated by first insulating layers 41A. The first insulating layers 41A may be penetrated by the vertical contact parts VCP of the contact patterns CTa. The vertical contact parts VCP of the contact patterns CTa may be electrically coupled to the first interconnection structures Ia, respectively.

Each of the first interconnection structures Ia may include a lower metal pattern UMa and a via contact plug VCTa. The lower metal pattern UMa may be a line pattern extending in a plane that extends in the first direction D1 and the second direction D2. The via contact plug VCTa may be electrically coupled to the block select circuit BSC described with reference to FIG. 2B. The configuration of each of the first interconnection structures Ia may be variously changed without being limited to those illustrated in the drawings.

The blocking insulating layer BI may be formed on the surface of each of the conductive patterns CP1 to CPn. The surface of each of the conductive patterns CP1 to CPn may include a first side portion S1, a second side portion S2, a top surface TS, and a bottom surface BS. The first side portion S1 and the second side portion S2 may form the sidewall SW shown in FIG. 4. The first side portion S1 faces the corresponding sidewall contact part SCP, and the second side portion S2 faces the vertical contact part VCP.

The gate stack GST may be covered with an upper insulating layer UIL. A step due to the stepped structure of the gate stack GST may be compensated by the upper insulating layer UIL.

Referring to FIG. 5A, the sidewall contact parts SCP of the contact patterns CTa shown in FIG. 4 may be formed on the sidewall of the conductive patterns CP1 to CPn forming the stepped structure. The sidewall contact parts SCP may extend between adjacent interlayer insulating layers ILD in the third direction D3. Each of the sidewall contact parts SCP may pass through the blocking insulating layer BI, and may come into direct contact with the corresponding first side portion S1.

The interlayer insulating layers ILD may include an upper interlayer insulating layer and a lower interlayer insulating layer that are adjacent to each other in the third direction D3. Each of the conductive patterns CP1 to CPn may be disposed between a pair of corresponding upper interlayer insulating layer and lower interlayer insulating layer.

Referring to FIG. 5B, any conductive pattern CP corresponding to each of the conductive patterns CP1 to CPn may be disposed between an upper interlayer insulating layer ILD_B and a lower interlayer insulating layer ILD_A. The blocking insulating layer BI may prevent the upper interlayer insulating layer ILD_B and the lower interlayer insulating layer ILD_A from coming into direct contact with the conductive pattern CP.

The conductive pattern CP may be formed of various conductive materials. In an embodiment, the conductive pattern CP may include a barrier layer 61A and a metal layer 63A.

The sidewall contact part SCP coming into contact with the first side portion S1 of the conductive pattern CP may be formed of various conductive materials. In an embodiment, the sidewall contact part SCP may include a barrier layer 71A and a metal layer 73A.

The barrier layer 61A may be a material layer for preventing the diffusion of metal, and may include metal nitride such as a titanium nitride layer. The metal layer 63A may be formed of various metals capable of securing the resistance of the conductive pattern CP, and may include tungsten, for example.

The barrier layers 61A and 71A may be material layers for preventing the diffusion of metal, and may include metal nitride such as a titanium nitride layer. The metal layers 63A and 73A may be formed of various metals capable of securing the resistance of the conductive pattern CP or the sidewall contact part SCP, and may include tungsten, for example.

The sidewall contact part SCP may be disposed between an end EG of the upper interlayer insulating layer ILD_B and the lower interlayer insulating layer ILD_A. The sidewall contact part SCP may extend onto the sidewall of the upper interlayer insulating layer ILD_B. In other words, the sidewall contact part SCP may farther protrude in the third direction D3 than the conductive pattern CP.

Referring to FIG. 5C, the vertical contact parts VCP of the contact patterns CTa shown in FIG. 4 may extend parallel to each other. The vertical contact parts VCP may extend to pass through the upper insulating layer UIL.

The vertical contact parts VCP may be spaced apart from the conductive patterns CP1 to CPn by the spacer insulating layers 51S. Each of the spacer insulating layers 51S may be disposed between adjacent interlayer insulating layers ILD in the third direction D3. As illustrated in FIG. 5C, the spacer insulating layers 51S may include patterns spaced apart from each other in the third direction D3. However, the present disclosure is not limited thereto. Although not shown in the drawings, the spacer insulating layers 51S may include extensions extending between the vertical contact parts VCP and the interlayer insulating layers ILD, and the spacer insulating layers 51S adjacent to each other in the third direction D3 may be coupled to each other by the extensions.

Referring to FIG. 5D, the sidewall contact part SCP of each of the contact patterns CTa may extend in a direction crossing the corresponding vertical contact part VCP.

Referring to FIG. 5E, the barrier layer 71A and the metal layer 73A described with reference to FIG. 5B may extend to form the vertical contact part VCP.

The blocking insulating layer BI may extend to surround the lower interlayer insulating layer ILD_A, the upper interlayer insulating layer ILD_B, the bottom surface BS, the top surface TS, and the second side portion S2 of the conductive pattern CP facing the spacer insulating layer 51S.

Figure 6:
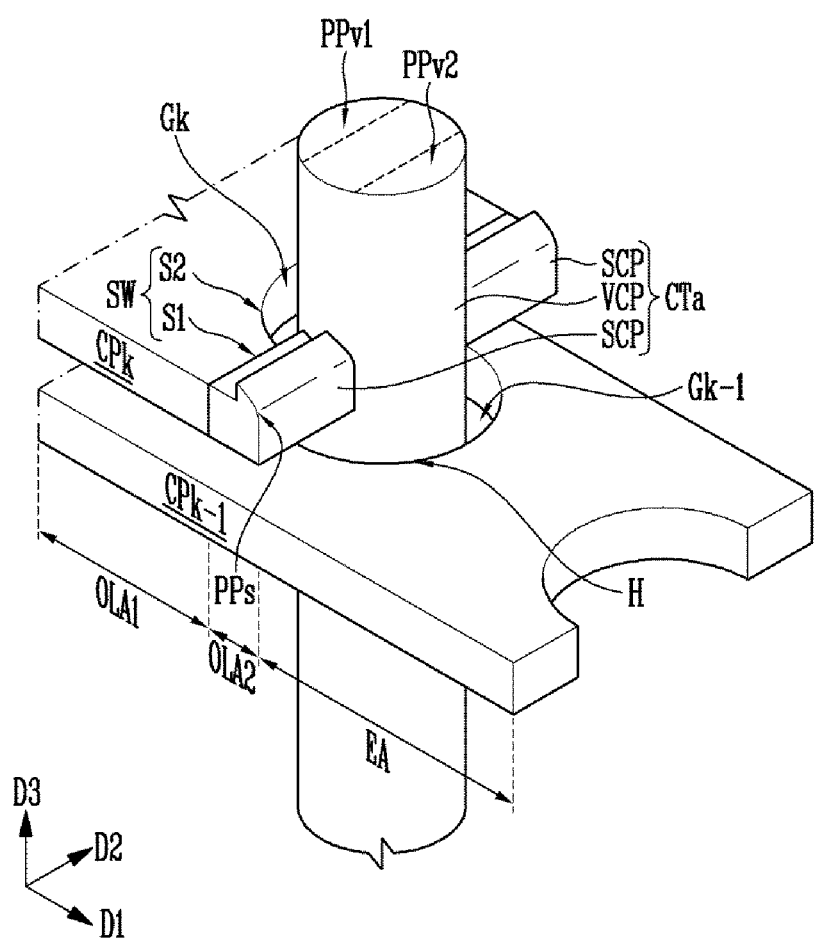
FIG. 6 is a perspective view of a contact pattern shown in FIG. 4.

FIG. 6 is a perspective view of the contact pattern CTa shown in FIG. 4.

Referring to FIG. 6, the vertical contact part VCP of the contact pattern CTa may extend in the third direction D3. The sidewall contact part SCP of the contact pattern CTa may extend from the vertical contact part VCP in a direction crossing the vertical contact part VCP.

The contact pattern CTa comes into contact with a corresponding conductive pattern (e.g. CPk) among the conductive patterns CP1 to CPn described with reference to FIGS. 5A, 5C and 5D, and passes through conductive patterns thereunder. For the convenience of description, FIG. 6 shows a k-th conductive pattern CPk and a k−1-th conductive pattern CPk-1 among the conductive patterns CP1 to CPn described with reference to FIGS. 5A, 5C, and 5D, and shows the contact pattern CTa coming into contact with the k-th conductive pattern CPk. Hereinafter, the k-th conductive pattern CPk coming into contact with the contact pattern CTa is referred to as an upper conductive pattern, while the k−1-th conductive pattern CPk-1 disposed under the upper conductive pattern CPk is referred to as a lower conductive pattern.

The upper conductive pattern CPk may overlap the lower conductive pattern CPk-1. In an embodiment, the upper conductive pattern CPk may overlap a portion of the lower conductive pattern CPk-1. As described above with reference to FIG. 4, the upper conductive pattern CPk includes the sidewall SW. The first side portion S1 of the sidewall SW may come into contact with the sidewall contact part SCP. Thus, the upper conductive pattern CPk may be electrically coupled to the contact pattern CTa. The second side portion S2 of the sidewall SW may face the vertical contact part VCP, and be spaced apart from the vertical contact part VCP. That is, a gap Gk may be formed between the second side portion S2 and the vertical contact part VCP. In an embodiment, the second side portion S2 may be curved around a portion of the vertical contact part VCP and the first side portion S1 may be flat as illustrated in FIG. 6.

The lower conductive pattern CPk-1 may include a first overlap area OLA1, a second overlap area OLA2 extending from the first overlap area OLA1, and an extension area EA extending from the second overlap area OLA2. The first overlap area OLA1 is defined as an area overlapping the upper conductive pattern CPk, and the second overlap area OLA2 is defined as an area overlapping the sidewall contact part SCP. The second overlap area OLA2 may be disposed between the first overlap area OLA1 and the extension area EA.

The lower conductive pattern CPk-1 may have a hole H into which the vertical contact part VCP is inserted. The hole H may pass through the second overlap area OLA2, and extend into the first overlap area OLA2 and the extension area EA. An edge of the hole H may be spaced apart from the vertical contact part VCP. In other words, a gap Gk-1 may be formed between the lower conductive pattern CPk-1 and the vertical contact part VCP. Thus, the contact pattern CTa electrically coupled to the upper conductive pattern CPk may be spaced apart from the lower conductive pattern CPk-1. In an embodiment, the contact pattern CTa is electrically coupled to the upper conductive pattern CPk and is electrically isolated from the lower conductive pattern CPk-1 because of a gap Gk-1 located between the lower conductive pattern CPk-1 and the vertical contact part VCP.

The sidewall contact part SCP may include a protrusion PPs that farther protrudes upwards (i.e., in the third direction D3) than the upper conductive pattern CPk. The vertical contact part VCP may include a first protrusion PPv1 protruding towards the first side portion S1 of the upper conductive pattern CPk, and a second protrusion PPv2 protruding towards the extension area EA of the lower conductive pattern CPk-1.

Figure 7B:
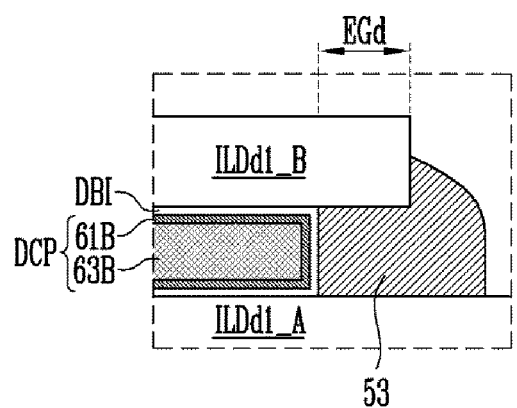
Figure 7C:
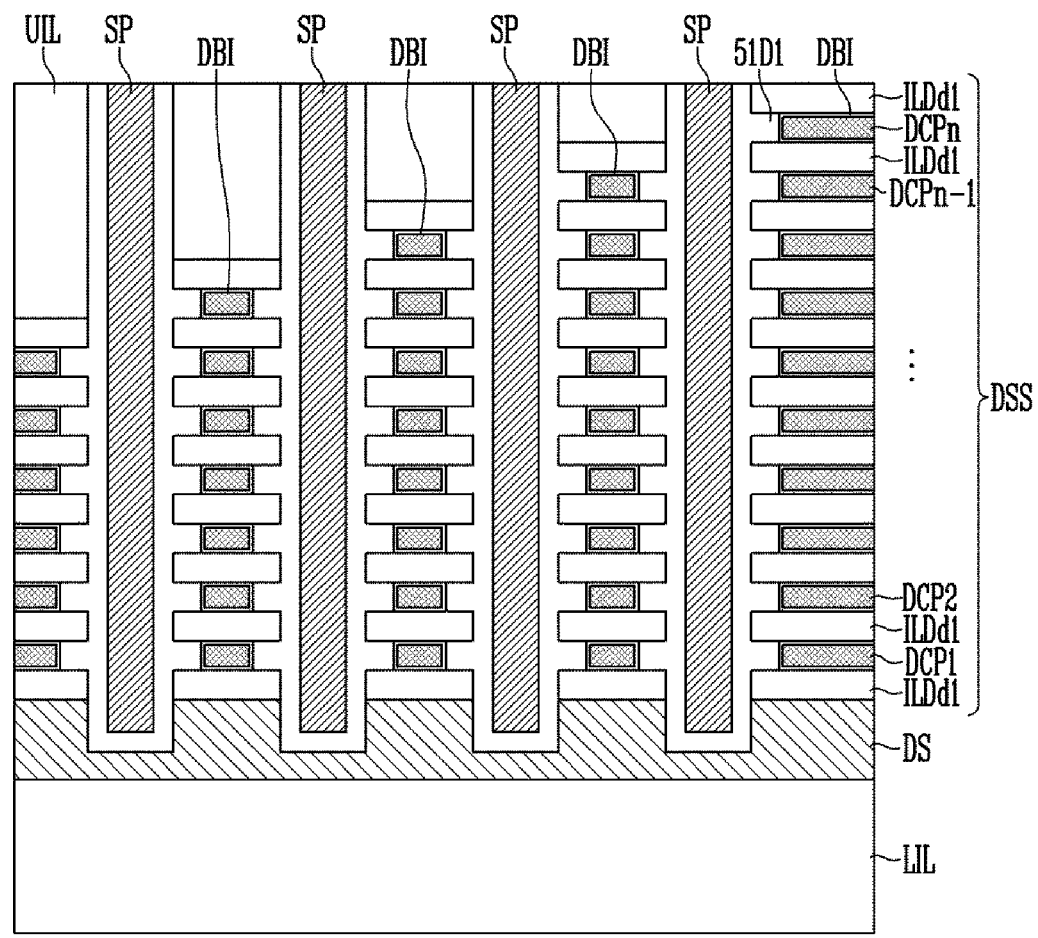
Figure 7D:
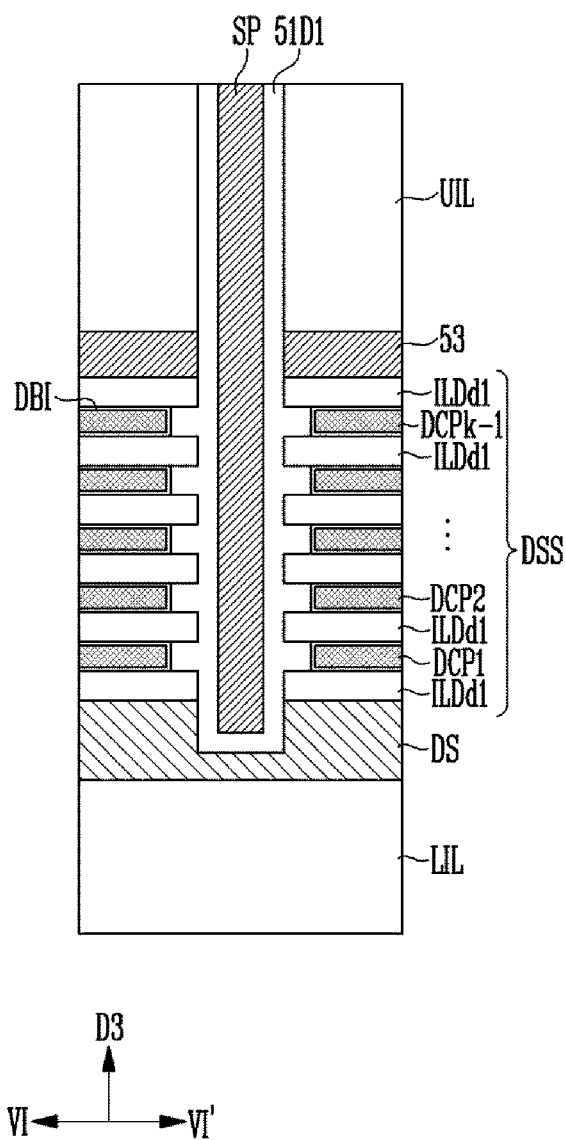

FIGS. 7A to 7D are sectional views of a dummy stepped structure DSS shown in FIG. 4. FIG. 7A is a sectional view taken along line IV-IV' of FIG. 4, and FIG. 7B is an enlarged view of area Z shown in FIG. 7A. FIG. 7C is a sectional view taken along line V-V' of FIG. 4. FIG. 7D is a sectional view taken along line VI-VI' of FIG. 4.

Referring to FIGS. 7A, 7C, and 7D, the dummy stepped structure DSS may further include first dummy interlayer insulating layers ILDd1 that are stacked while being spaced apart from each other in the third direction D3. The first dummy interlayer insulating layers ILDd1 may be disposed alternately with the dummy conductive patterns DCP1 to DCPn in the third direction D3. The lower insulating structure LIL and the doped semiconductor layer DS described with reference to FIGS. 5A, 5C, and 5D may extend to overlap the dummy stepped structure DSS. The upper insulating layer UIL described with reference to FIGS. 5A, 5C, and 5D may extend to overlap the dummy stepped structure DSS.

Each of the dummy conductive patterns DCP1 to DCPn may be enclosed by the dummy blocking insulating layer DBI. The dummy blocking insulating layer DBI may extend along an interface between the corresponding dummy conductive pattern and the pad sacrificial layer 53, interfaces between the corresponding dummy conductive pattern and the first dummy interlayer insulating layers ILDd1, and an interface between the corresponding dummy conductive pattern and the first dummy spacer insulating layer 51D1.

Referring to FIG. 7A, the pad sacrificial layers 53 shown in FIG. 4 may be formed, respectively, on the sidewalls of the dummy conductive patterns DCP1 to DCPn forming the stepped structure. The pad sacrificial layers 53 may extend between adjacent first dummy interlayer insulating layers ILDd1 in the third direction D3.

The first dummy interlayer insulating layers ILDd1 may include an upper dummy interlayer insulating layer and a lower dummy interlayer insulating layer that are adjacent to each other in the third direction D3. Each of the dummy conductive patterns DCP1 to DCPn may be disposed between a pair of corresponding upper dummy interlayer insulating layer and lower dummy interlayer insulating layer.

Referring to FIG. 7B, any dummy conductive pattern DCP that may form each of the dummy conductive patterns DCP1 to DCPn may be disposed between an upper dummy interlayer insulating layer ILDd1_B and a lower dummy interlayer insulating layer ILDd1_A. The dummy blocking insulating layer DBI may be disposed between each of the upper dummy interlayer insulating layer ILDd1_B, the lower dummy interlayer insulating layer ILDd1_A, and the pad sacrificial layer 53, and the dummy conductive pattern DCP.

The dummy conductive pattern DCP may be formed of the same conductive material as the conductive pattern CP described with reference to FIG. 5B. In an embodiment, the dummy conductive pattern DCP may include a barrier layer 61B and a metal layer 63B.

The pad sacrificial layer 53 may be disposed between an end EGd1 of the upper dummy interlayer insulating layer ILDd1_B and the lower dummy interlayer insulating layer ILDd1_A. The pad sacrificial layer 53 may extend onto the sidewall of the upper dummy interlayer insulating layer ILDd1_B. In other words, the pad sacrificial layer 53 may farther protrude in the third direction D3 than the dummy conductive pattern DCP.

Referring to FIG. 7C, the support pillars SP may extend in parallel with each other. The support pillars SP may extend into the doped semiconductor layer DS. The support pillars SP may be spaced apart from the doped semiconductor layer DS and the dummy conductive patterns DCP1 to DCPn by the first dummy spacer insulating layers 51D1.

Each of the first dummy spacer insulating layers 51D1 may be formed on a surface of the corresponding support pillar SP. Each of the first dummy spacer insulating layers 51D1 may extend along a sidewall and a bottom surface of the corresponding support pillar SP. Each of the first dummy spacer insulating layers 51D1 may extend between the first dummy interlayer insulating layers ILDd1 that are adjacent to each other in the third direction D3.

Referring to FIG. 7D, each of the pad sacrificial layers 53 may be spaced apart from the support pillar SP by the first dummy spacer insulating layer 51D1.

FIG. 8 is a sectional view of a dummy buffer stack DBS shown in FIG. 4. FIG. 8 is a sectional taken along line VII-VII' shown in FIG. 4.

Referring to FIG. 8, the dummy buffer stack DBS may further include second dummy interlayer insulating layers ILDd2 that are stacked while being spaced apart from each other in the third direction D3. The second dummy interlayer insulating layers ILDd2 may be disposed alternately with the horizontal sacrificial layers 45 in the third direction D3. The dummy buffer stack DBS may overlap a second interconnection structures Ib of an interconnection array 17 described with reference to FIG. 3. The second interconnection structure Ib may be embedded into the lower insulating structure LIL that extends to overlap the dummy buffer stack DBS.

The doped semiconductor layer DS may extend between the lower insulating structure LIL and the dummy buffer stack DBS. The doped semiconductor layer DS may be penetrated by the second insulating layer 41B overlapping the dummy buffer stack DBS.

The contact plug CTb may pass through the second insulating layer 41B and the lower insulating structure LIL to come into contact with the second interconnection structure Ib. The second interconnection structure Ib may include a lower metal pattern UMb and a via contact plug VCTb. The lower metal pattern UMb may be a line pattern that extends in a direction crossing the contact plug CTb. The via contact plug VCTb may be electrically coupled to the peripheral circuit 30 with reference to FIG. 1. The configuration of each of the second interconnection structures Ib may be variously changed without being limited to the embodiments illustrated in the drawings.

The contact plug CTb may be spaced apart from the horizontal sacrificial layers 45 by the second dummy spacer insulating layers 51D2. The second dummy spacer insulating layers 51D2 may be disposed between the second dummy interlayer insulating layers ILDd2 that are adjacent to each other in the third direction D3. As illustrated in FIG. 8, the second dummy spacer insulating layers 51D2 may include multiple patterns spaced apart from each other in the third direction D3. However, the present disclosure is not limited thereto. The second dummy spacer insulating layers 51D2 may include extensions that extend between the contact plug CTb and the second dummy interlayer insulating layers ILDd2, and the second dummy spacer insulating layers 51D2 that are adjacent to each other in the third direction D3 may be coupled to each other by the extensions.

Figure 9A:
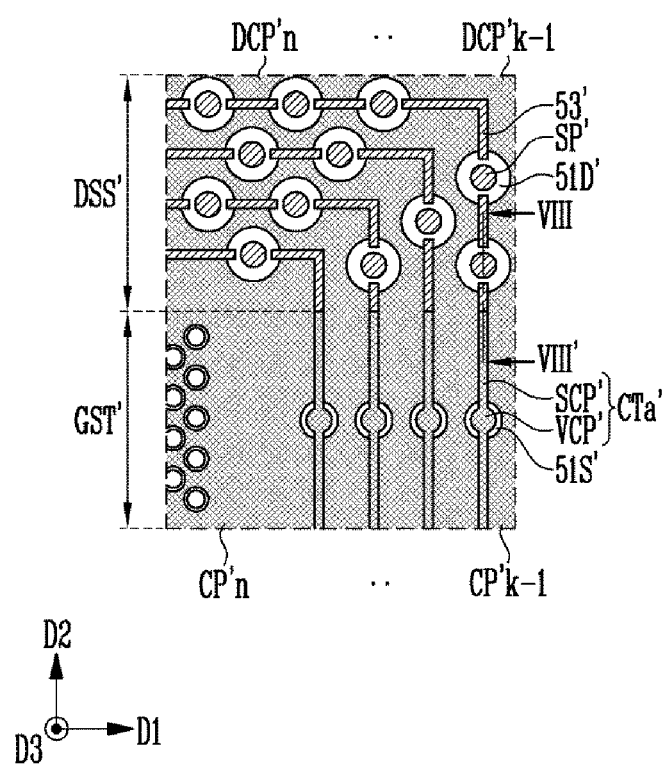
FIGS. 9A and 9B are a plan view and a sectional view illustrating a stack array in accordance with an embodiment.
Figure 9B:
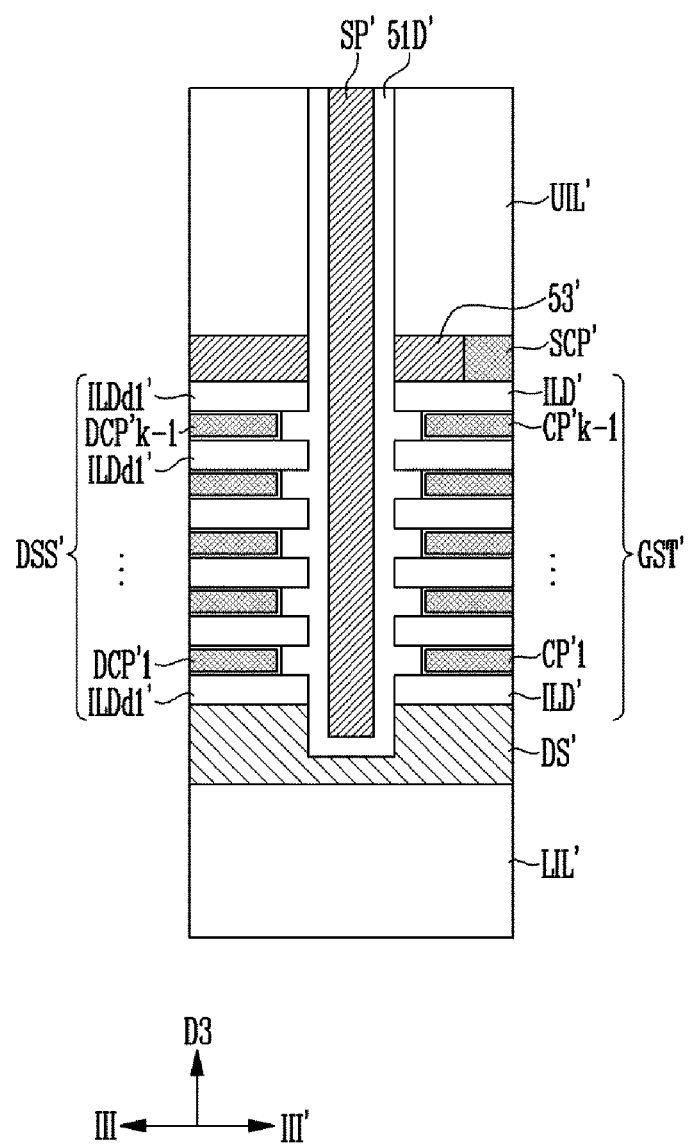

FIGS. 9A and 9B are a plan view and a sectional view illustrating a stack array in accordance with an embodiment. FIG. 9B is a sectional view taken along line VIII-VIII' of FIG. 9A. Hereinafter, those described in FIGS. 4, 5A to 5E, 6, and 7A to 7D will not be repeated.

Referring to FIGS. 9A and 9B, a dummy stepped structure DSS' and a gate stack GST' adjacent thereto may be coupled to each other. In other words, dummy conductive patterns DCP'1 to DCP'n of the dummy stepped structure DSS' may extend from conductive patterns CP'1 to CP'n of the gate stack GST', respectively. Furthermore, dummy interlayer insulating layers ILDd1' of the dummy stepped structure DSS' may extend from interlayer insulating layers ILD' of the gate stack GST', respectively.

As described with reference to FIGS. 5A, 5C, 5D, 7A, 7C, and 7D, the dummy stepped structure DSS' and the gate stack GST' may overlap a lower insulating structure LIL' and a doped semiconductor layer DS', and may be covered with an upper insulating layer UIL'.

Sidewall contact parts SCP' of contact patterns CTa' may be coupled, respectively, to pad sacrificial layers adjacent to the gate stack GST' among pad sacrificial layers 53'. Each of the sidewall contact parts SCP' may come into contact with the sidewall of the corresponding pad sacrificial layer 53' to be coupled to the pad sacrificial layer 53'.

Dummy spacer insulating layers 51D' surrounding support pillars SP', respectively, may separate pad sacrificial layers disposed on the same level from each other. Spacer insulating layers 51S' surrounding vertical contact parts VCP' may be penetrated by the sidewall contact parts SCP'.

FIGS. 10A, 10B, 11, 12A, 12B, 13A to 13C, 14A to 14C, 15A, 15B, 16A, 16B, 17A to 17C, 18A, 18B, 19A to 19C, and 20A to 20C are diagrams illustrating a method of manufacturing a semiconductor memory device in accordance with an embodiment.

Figure 10A:
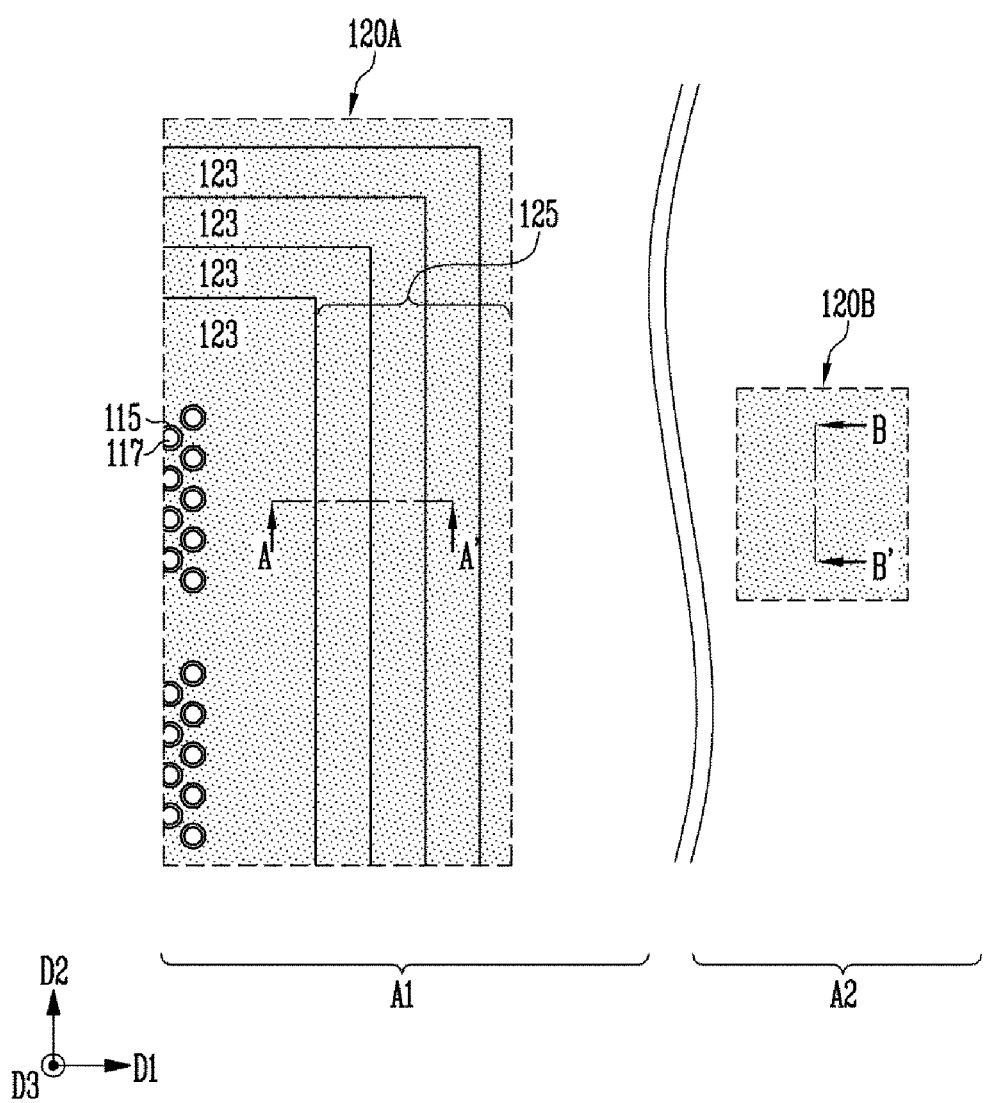

FIG. 10A is a plan view illustrating a step of forming a preliminary stepped structure 120A and a dummy buffer stack 120B, and FIG. 10B illustrates sections taken along line A-A' and line B-B' of FIG. 10A.

Referring to FIGS. 10A and 10B, prior to forming the preliminary stepped structure 120A and the dummy buffer stack 120B, a step of forming a substrate having a peripheral circuit, a step of forming an interconnection array on a first area A1 and a second area A2 of the substrate, and a step of forming a doped semiconductor layer 111 penetrated by insulating layers 113 may be performed.

The peripheral circuit corresponds to the peripheral circuit 30 described with reference to FIG. 1, and a first area A1 and a second area A2 correspond to the first area A1 and the second area A2 described with reference to FIG. 3.

An interconnection array may include first and second interconnection structures 105A and 105B embedded into a lower insulating structure 107 covering the first area A1 and the second area A2. The first and second interconnection structure 105A and 105B may be formed of various conductive materials to be electrically coupled to the peripheral circuit 30 described with reference to FIG. 1, and may include various configurations. The first interconnection structures 105A may overlap the first area A1, and the second interconnection structure 105B may overlap the second area A2.

The doped semiconductor layer 111 may be formed on the lower insulating structure LIL. The insulating layers 113 may overlap the first and second interconnection structures 105A and 105B, respectively. The doped semiconductor layer 111 may include at least one of an n-type dopant and a p-type dopant. The doped semiconductor layer 111 may be used as the common source line CSL described with reference to FIG. 2B. In an embodiment, the doped semiconductor layer 111 may include an n-type doped silicon layer.

The preliminary stepped structure 120A and the dummy buffer stack 120B may be formed on the doped semiconductor layer 111. The step of forming the preliminary stepped structure 120A and the dummy buffer stack 120B may include a step of forming the interlayer insulating layers 121 and the horizontal sacrificial layers 123 that are alternately stacked in the third direction D3, a step of forming the channel structure 117 enclosed by the memory layer 115, and a step of etching the interlayer insulating layers 121 and the horizontal sacrificial layers 123 to define multiple steps 125.

The horizontal sacrificial layers 123 may be made of a material having an etching rate different from that of the interlayer insulating layers 121. For example, the interlayer insulating layers 121 may include an oxide layer such as silicon oxide, and the horizontal sacrificial layers 123 may include a nitride layer such as silicon nitride.

The step of forming the channel structure 117 enclosed by the memory layer 115 may include a step of forming channel holes passing through the interlayer insulating layers 121 and the horizontal sacrificial layers 123, a step of forming the memory layer 115 on the sidewall of each channel hole, and a step of filling a central area of each channel hole defined by the memory layer 115 with the corresponding channel structure 117. The memory layer 115 may be formed of the same material as that of the memory layer ML described with reference to FIG. 4. The channel structure 117 may include a semiconductor layer that may be used as a channel area of a memory string.

Although not shown in the drawings, slit insulating layers may be formed after the multiple steps 125 are formed. The slit insulating layers may pass through the interlayer insulating layers 121 and the horizontal sacrificial layers 123 so that the preliminary stepped structure 120A is separated on the basis of a memory block and the preliminary stepped structure 120A and the dummy buffer stack 120B are separated from each other.

The preliminary stepped structure 120A formed by alternately stacking the interlayer insulating layers 121 and the horizontal sacrificial layers 123 may be formed on the first area A1 through the above-described processes. Furthermore, while the preliminary stepped structure 120A is formed, the dummy buffer stack 120B formed by alternately stacking the interlayer insulating layers 121 and the horizontal sacrificial layers 123 may be formed on the second area A2.

FIG. 11 is a sectional view illustrating a step of forming first grooves 127.

Referring to FIG. 11, the first grooves 127 may be formed by etching portions of the horizontal sacrificial layers 123 from the sidewalls of the horizontal sacrificial layers 123 forming the sidewalls of the multiple steps 125 shown in FIG. 10B. The first grooves 127 may be defined between adjacent interlayer insulating layers 121 in the third direction D3.

Figure 12A:
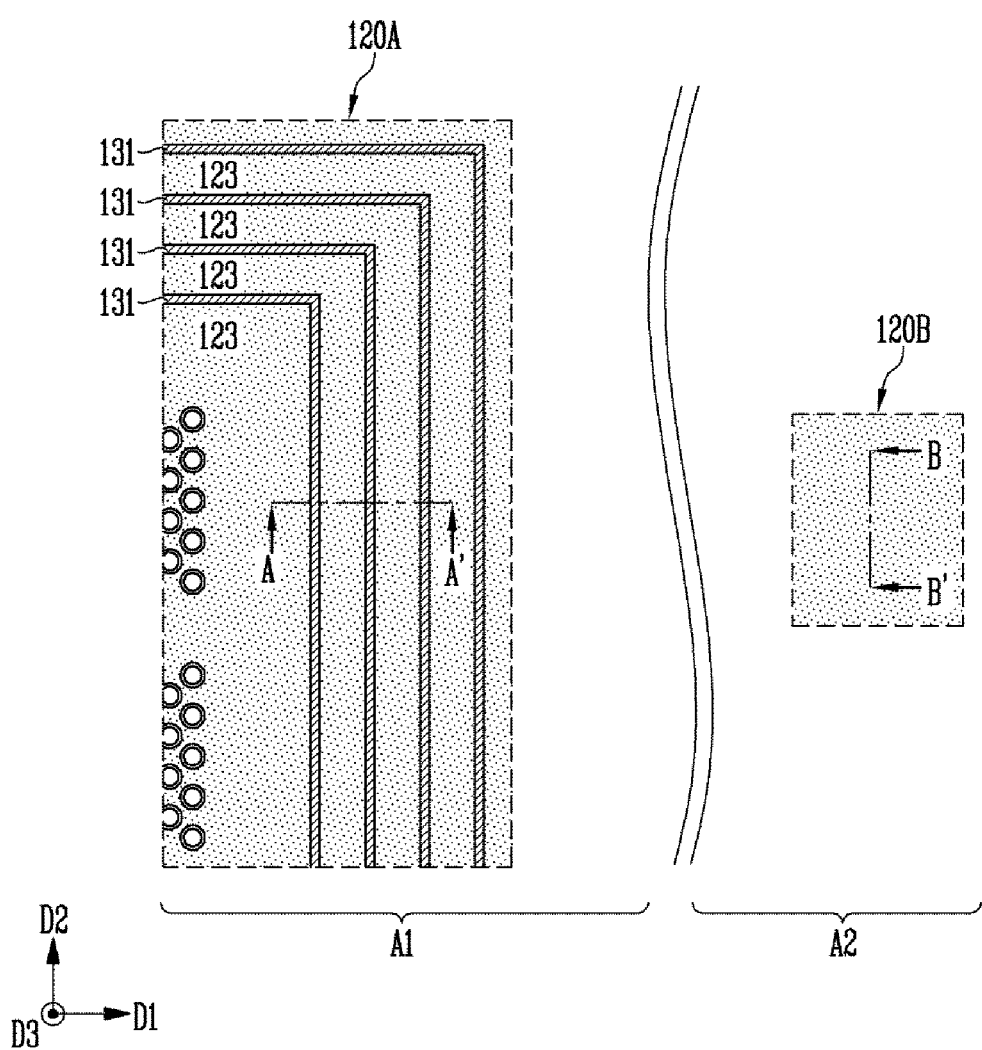

FIGS. 12A and 12B are plan views illustrating a step of forming the pad sacrificial layers 131, and FIG. 12B illustrates sections taken along line A-A' and line B-B' of FIG. 12A.

Referring to FIGS. 12A and 12B, the pad sacrificial layers 131 may be formed, respectively, on the sidewalls 123S of the horizontal sacrificial layers 123 among the sidewalls of the preliminary stepped structure 120A. The pad sacrificial layers 131 may include a material having etching resistance to an etching material for selectively removing the horizontal sacrificial layers 123 in a subsequent process. In an embodiment, the horizontal sacrificial layers 123 formed of the nitride layer may be selectively removed using phosphoric acid in the subsequent process, and the pad sacrificial layers 131 may include a material having higher etching resistance to phosphoric acid than the nitride layer. For example, the pad sacrificial layers 131 may include polysilicon, metal, TiN or SiCN.

The pad sacrificial layers 131 may be formed to fill the first grooves 127 described with reference to FIG. 11. The step of forming the pad sacrificial layers 131 may include a step of forming the sacrificial layer on the surface of the preliminary stepped structure 120A to fill the first grooves 127, and a step of etching a portion of the sacrificial layer using an etch-back process to separate the sacrificial layer into the pad sacrificial layers 131. Each of the pad sacrificial layers 131 may protrude onto the sidewall of the interlayer insulating layer 121 disposed thereon.

Figure 13A:
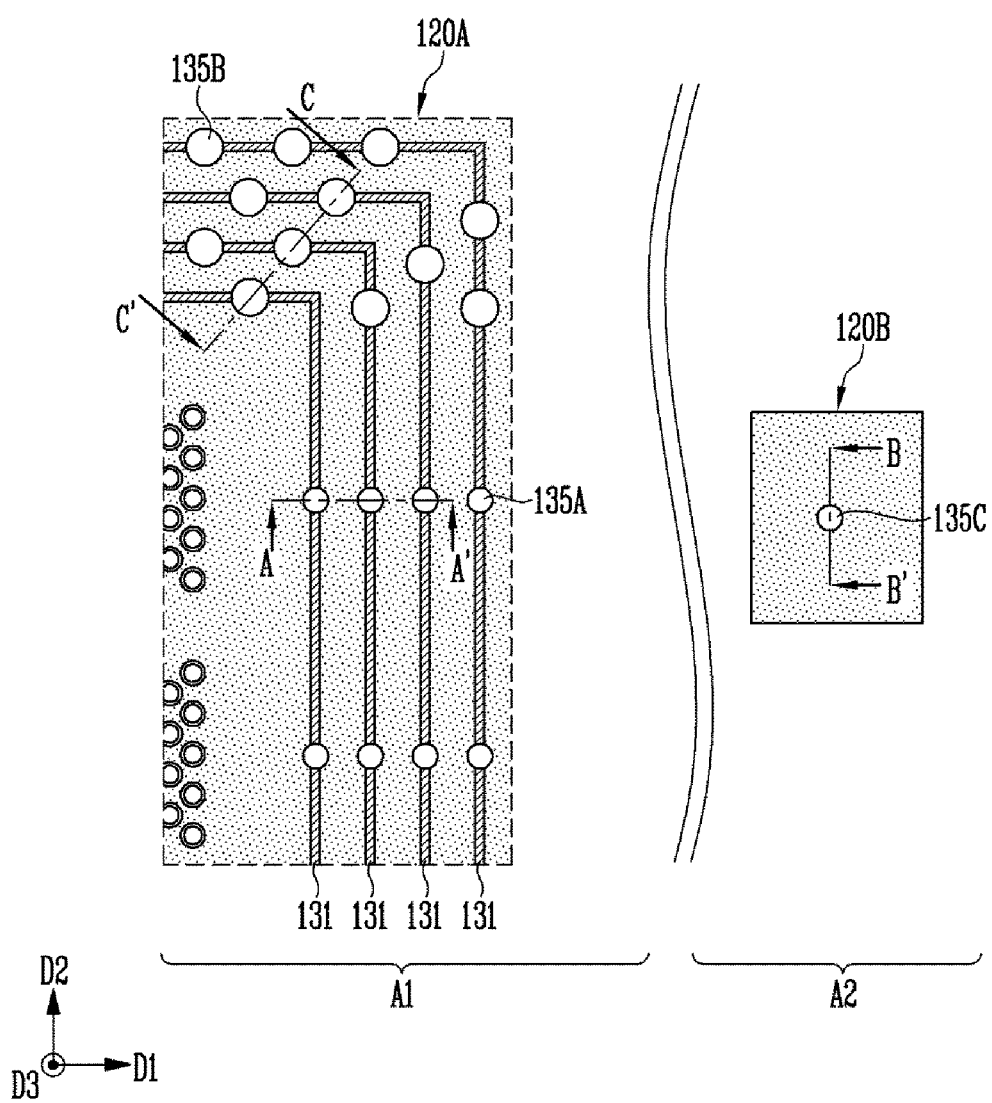
Figure 13C:
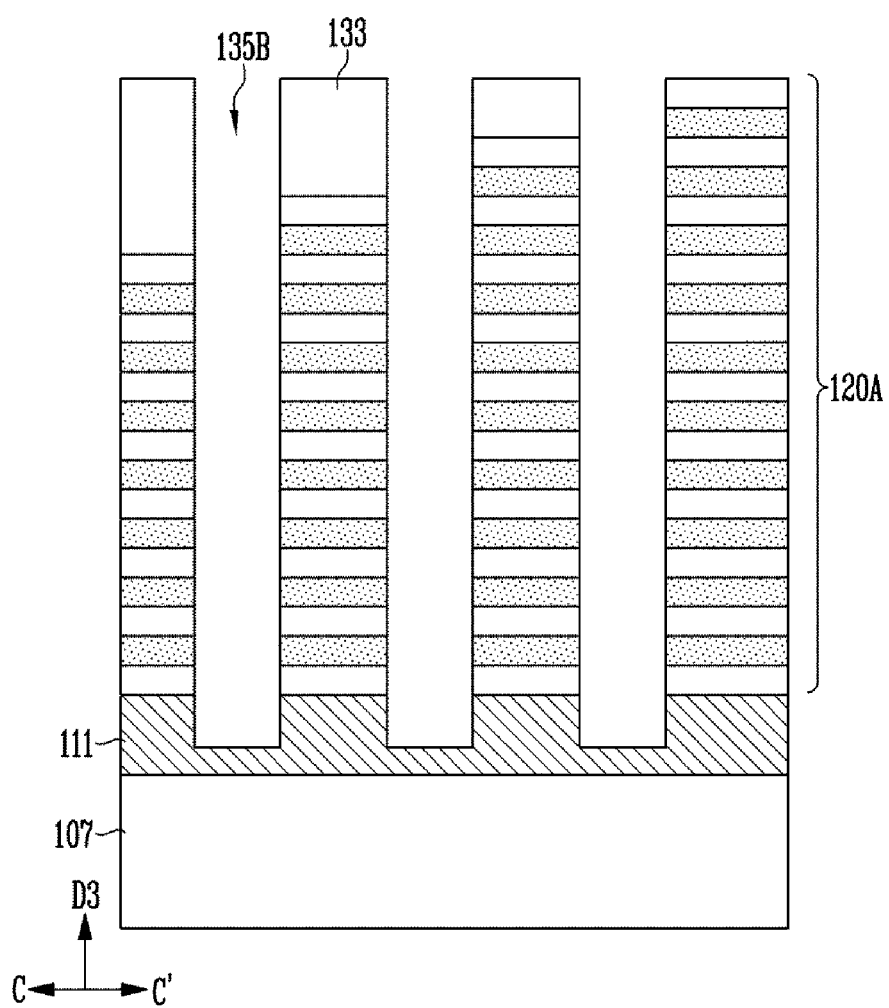

FIG. 13A is a plan view illustrating a step of forming first to third holes 135A to 135C, FIG. 13B illustrates sections taken along line A-A' and line B-B' of FIG. 13A, and FIG. 13C illustrates a section taken along line C-C' of FIG. 13A.

Referring to FIGS. 13A to 13C, a first upper insulating layer 133 covering the preliminary stepped structure 120A may be formed, prior to forming the first to third holes 135A to 135C. The first to third holes 135A to 135C may be formed by etching the first upper insulating layer 133, the pad sacrificial layers 131, the preliminary stepped structure 120A, the dummy buffer stack 120B, and the insulating layers113. Here, the doped semiconductor layer DS may serve as an etch stop layer.

The first holes 135A may extend to pass through the pad sacrificial layers 131, respectively, and to pass through the preliminary stepped structure 120A overlapping the pad sacrificial layers 131. Furthermore, the first holes 135A may extend to pass through the insulating layers 113 formed in the first area A1. The first interconnection structures 105A may be exposed, respectively, by the first holes 135A.

Each of the pad sacrificial layers 131 may be penetrated by the corresponding second hole 135B. The second hole 135B may pass through the preliminary stepped structure 120A, and extend into the doped semiconductor layer 111. While the first to third holes 135A to 135C are formed, the doped semiconductor layer 111 may serve as an etch stop layer.

The third hole 135C may pass through the dummy buffer stack 120B, and extend to pass through the insulating layer 113 formed in the second area A2. The second interconnection structure 105B may be exposed by the third hole 135C.

According to the embodiment of the present disclosure, since the second hole 135B and the third hole 135C may be formed while the first holes 135A are formed, it is possible to simplify the process of manufacturing the semiconductor memory device. Furthermore, according to the embodiment of the present disclosure, since the first holes 135A, the second hole 135B, and the third hole 135C are formed by etching the preliminary stepped structure 120A and the dummy buffer stack 120B including the same material layers, it is possible to reduce a process variation due to a difference in physical properties of materials that are to be etched.

Figure 14A:
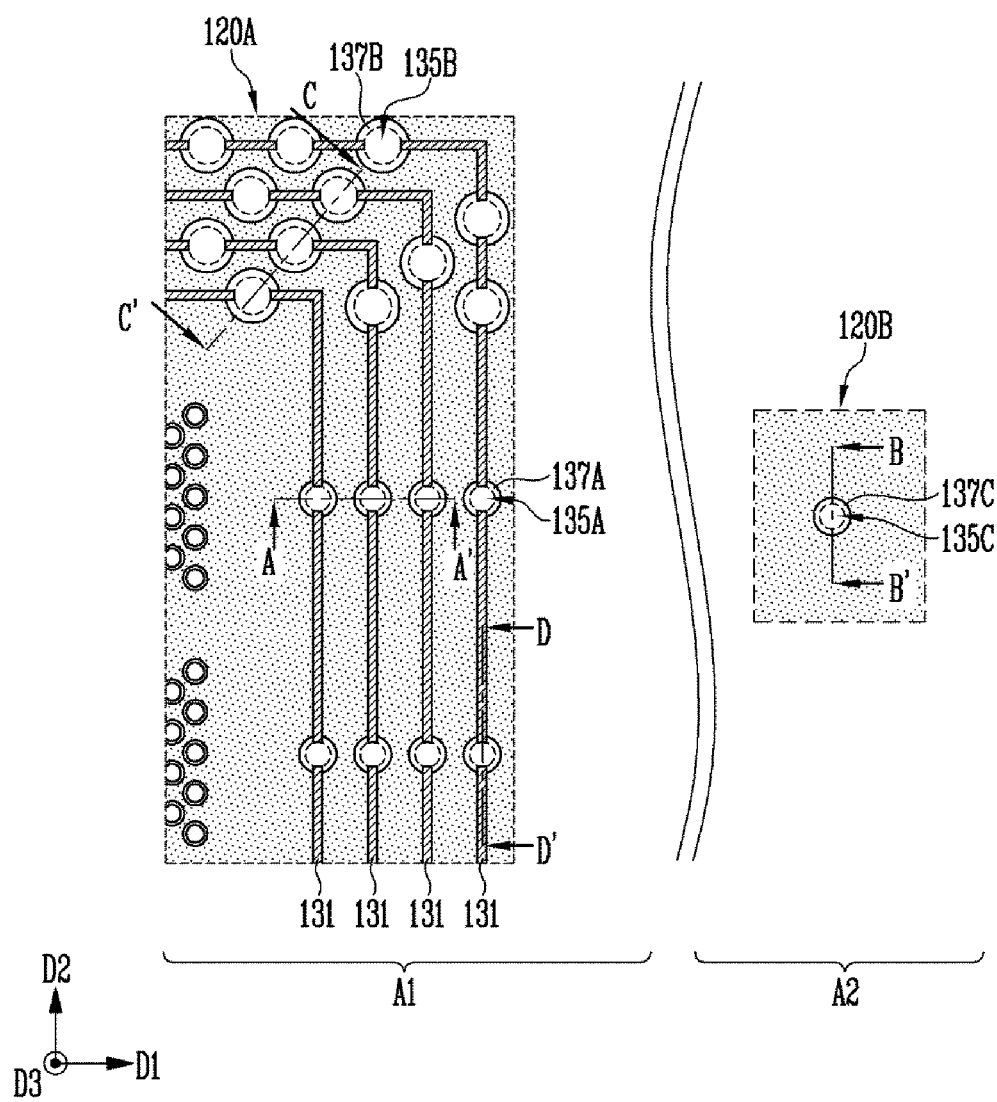
Figure 14B:
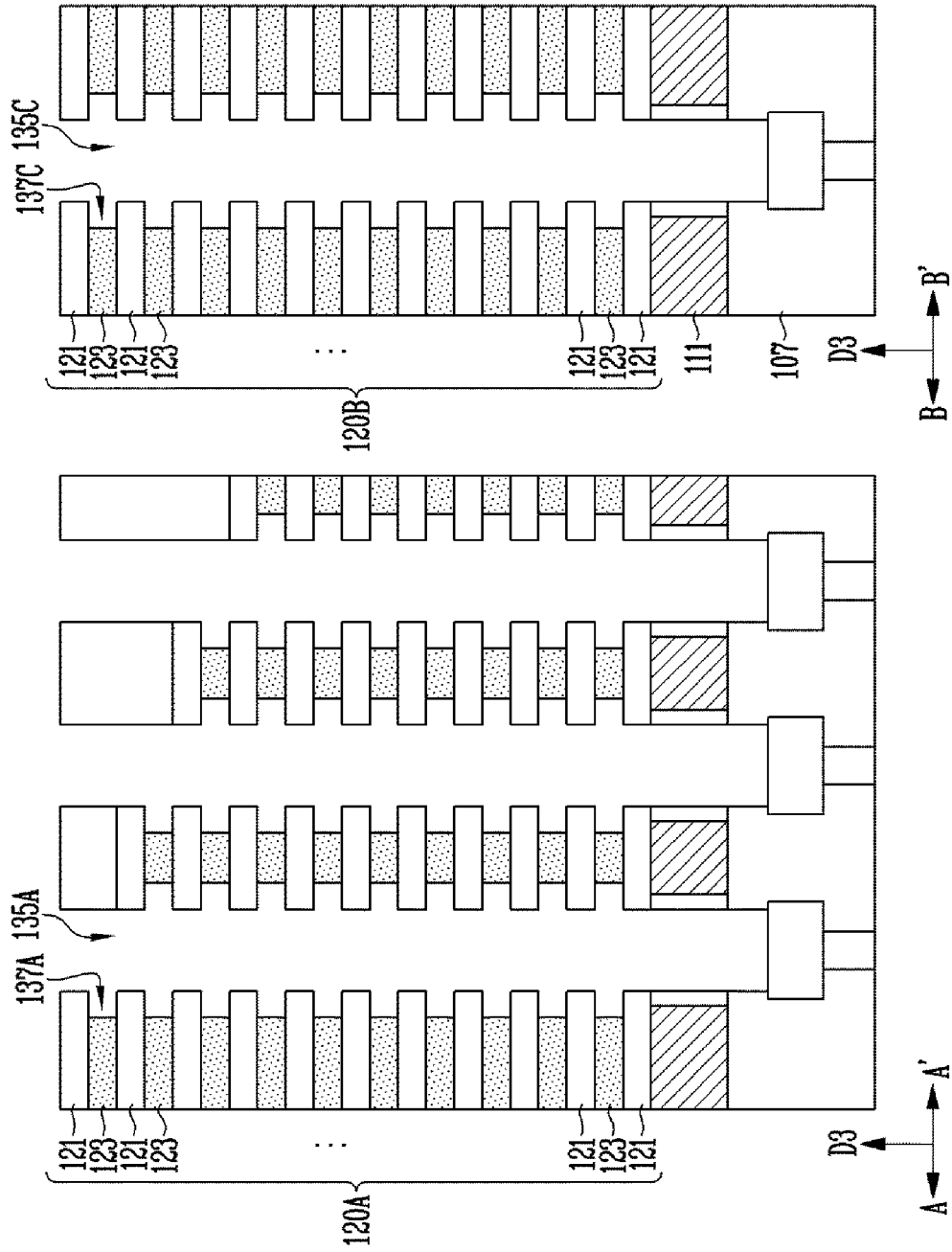
Figure 14C:
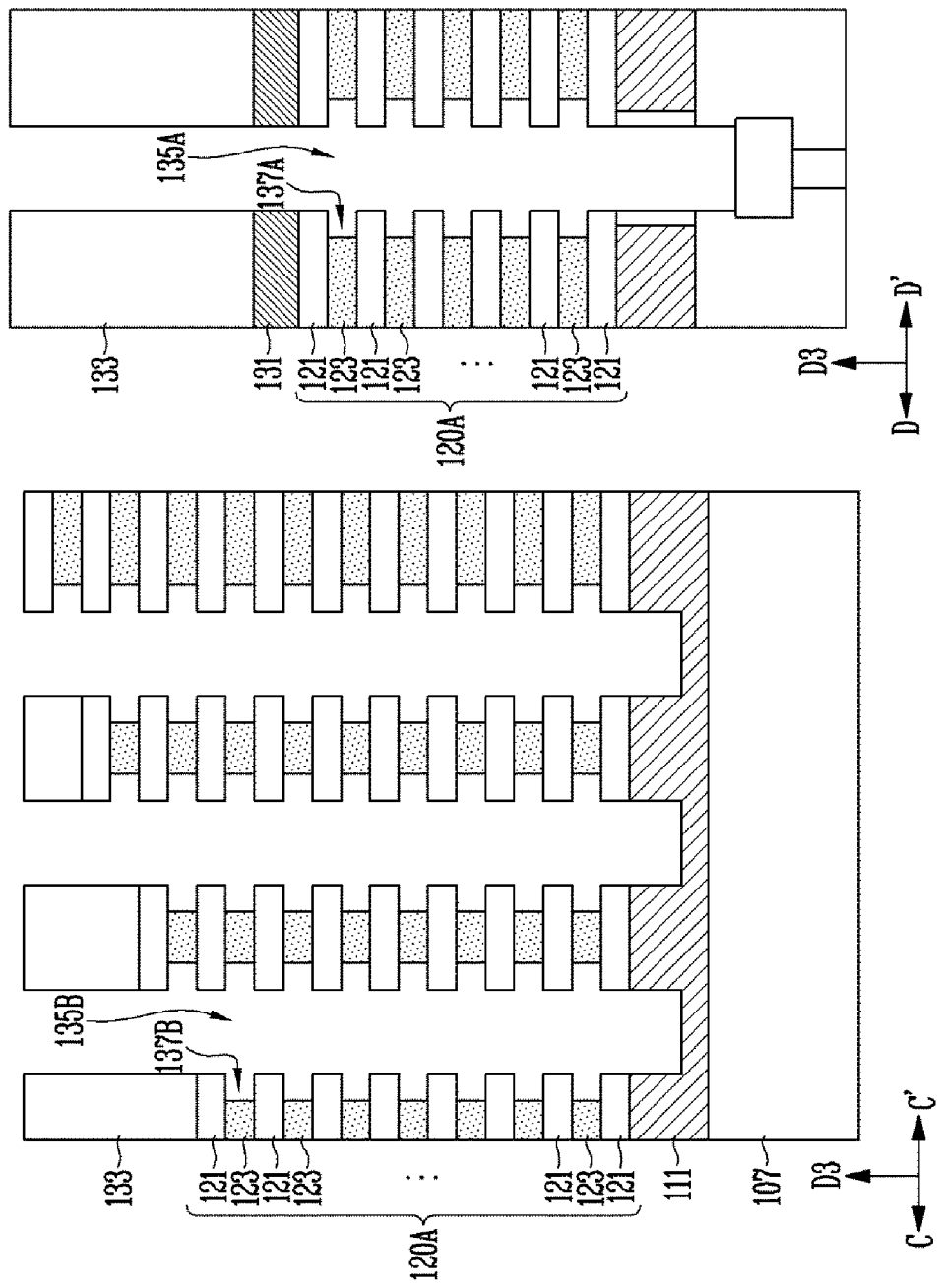

FIG. 14A is a plan view illustrating a step of forming second grooves 137A, 137B, and 137C, FIG. 14B illustrates sections taken along line A-A' and line B-B' of FIG. 14A, and FIG. 14C illustrates sections taken along line C-C' and line D-D' of FIG. 14A.

Referring to FIGS. 14A to 14C, the second grooves 137A, 137B, and 137C may be formed by etching the horizontal sacrificial layers 123 through the first to third holes 135A to 135C. In this case, an etching material may be used to selectively etch the horizontal sacrificial layers 123. For example, the horizontal sacrificial layers 123 may be selectively etched through phosphoric acid. The second grooves 137A, 137B, and 137C may be disposed between adjacent interlayer insulating layers 121 in the third direction D3.

FIGS. 15A and 15B are sectional views illustrating a step of forming spacer insulating layers 141A and first and second dummy spacer insulating layers 141B and 141C, and a step of forming first and second sacrificial pillars 143A and 143C and a support pillar 143B.

Referring to FIGS. 15A and 15B, the step of forming the spacer insulating layers 141A and the first and second dummy spacer insulating layers 141B and 141C may include a step of forming an insulating layer on a surface of each of the first to third holes 135A to 135C to fill the second grooves 137A to 137C described with reference to FIGS. 14A to 14C. The insulating layer may be an oxide layer.

Each of the spacer insulating layers 141A may extend along the sidewall and the bottom surface of the corresponding first hole 135A among the first holes 135A shown in FIGS. 14A to 14C, and fill the second grooves 137A coupled to the first hole 135A.

While the spacer insulating layers 141A are formed, the first dummy spacer insulating layer 141B may be formed. The first dummy spacer insulating layer 141B may extend along the sidewall and the bottom surface of the second hole 135B shown in FIGS. 14A and 14C, and fill the second grooves 137B coupled to the second hole 135B.

While the spacer insulating layers 141A are formed, the second dummy spacer insulating layer 141C may be formed. The second dummy spacer insulating layer 141C may extend along the sidewall and the bottom surface of the third hole 135C shown in FIGS. 14A and 14B, and fill the second grooves 137C coupled to the third hole 135C.

The step of forming the first and second sacrificial pillars 143A and 143C and the support pillar 143B may include a step of forming a sacrificial layer to fill the first to third holes 135A to 135C shown in FIGS. 14A to 14C. The sacrificial layer may be formed of a material different from materials forming the spacer insulating layers 141A and the first and second dummy spacer insulating layers 141B and 141C. For example, the sacrificial layer may include polysilicon, metal, TiN or SiCN. In an embodiment, the sacrificial layer may be the same material as that of the pad sacrificial layers 131 shown in FIG. 14A.

The first sacrificial pillars 143A may be formed on the spacer insulating layers 141A, respectively. Each of the first sacrificial pillars 143A may fill a central area of the corresponding first hole 135A among the first holes 135A shown in FIGS. 14A to 14C.

While the first sacrificial pillars 143A are formed, the support pillar 143B may be formed on the first dummy spacer insulating layer 141B. The support pillar 143B may fill the central area of the second hole 135B shown in FIGS. 14A and 14C.

While the first sacrificial pillars 143A are formed, the second sacrificial pillar 143C may be formed on the second dummy spacer insulating layer 141C. The second sacrificial pillar 143C may fill the central area of the third hole 135C shown in FIGS. 14A and 14B.

Subsequently, the second upper insulating layer 145 may be formed on the first upper insulating layer 133. The second upper insulating layer 145 may extend to cover the first and second sacrificial pillars 143A and 143C and the support pillar 143B.

FIGS. 16A, 16B, and 17A to 17C are diagrams illustrating a step of replacing the horizontal sacrificial layers 123 with the conductive patterns 155.

Referring to FIGS. 16A, 16B, and 17A to 17C, the step of replacing the horizontal sacrificial layers 123 with the conductive patterns 155 may include a step of forming slits 149 passing through the preliminary stepped structure on the first area A1, a step of removing the horizontal sacrificial layers 123 on the first area A1 through the slits 149 to open the first horizontal spaces 151, and a step of forming the conductive patterns 155 in the first horizontal spaces 151. The pad sacrificial layers may be separated into first and second sacrificial patterns 131A and 131B by the slits 149.

Figure 17A:
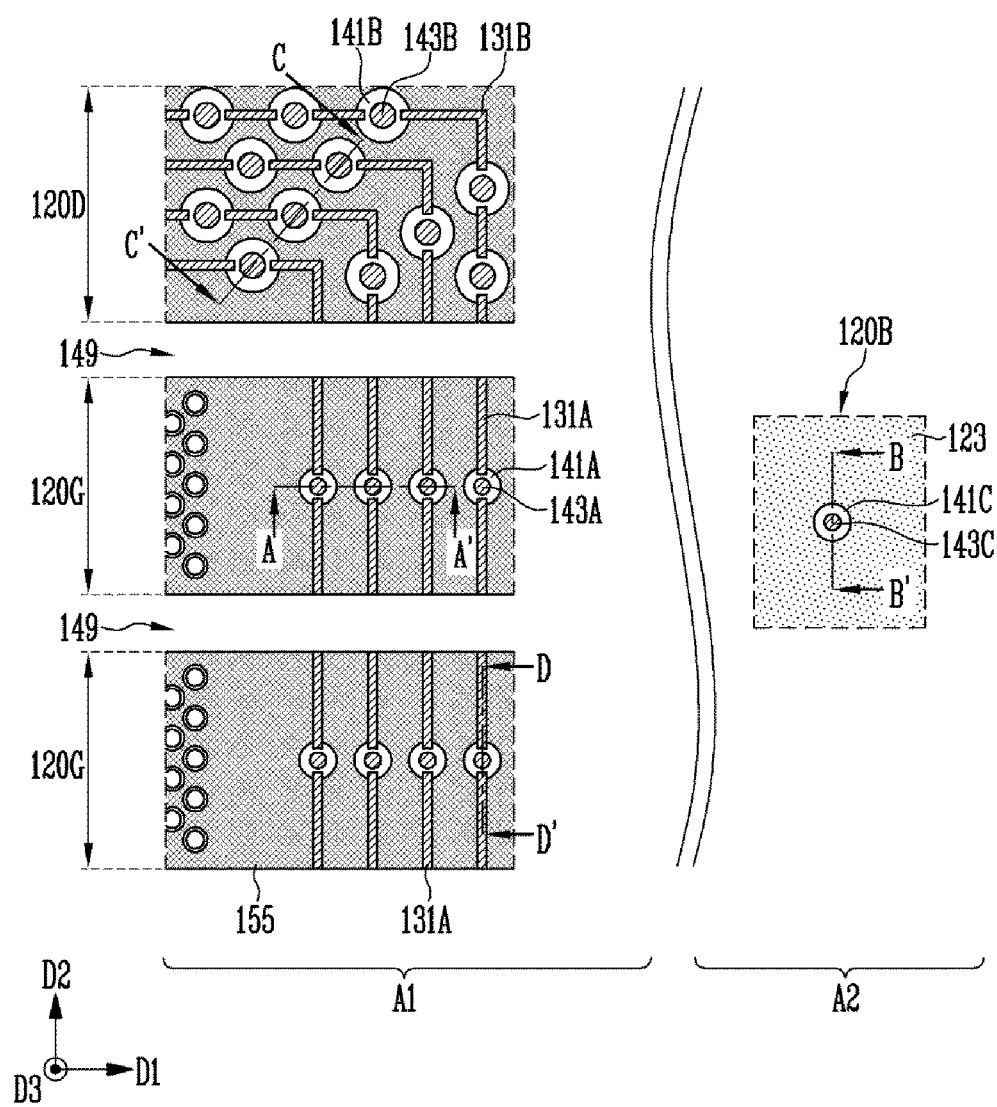

The layout of the slits 149 shown in FIG. 17A may be variously changed according to the design of the semiconductor memory device. Although the slits 149 of FIG. 17A are illustrated in consideration of the layout of the slits SI of FIG. 4, the layout of the slits 149 may be changed according to the layout of the semiconductor memory device of FIGS. 9A and 9B.

FIGS. 16A and 16B are sectional views illustrating the step of forming the first horizontal spaces 151.

Referring to FIGS. 16A and 16B, the first horizontal spaces 151 may be defined between the interlayer insulating layers 121 that are adjacent to each other in the third direction D3.

The first sacrificial pillars 143A and the support pillar 143B may be protected by the spacer insulating layers 141A and the first dummy spacer insulating layer 141B without being exposed by the first horizontal spaces 151.

The horizontal sacrificial layers 123 of the dummy buffer stack 120B may remain to surround the second sacrificial pillar 143C and the second dummy spacer insulating layer 141C.

The first sacrificial pillars 143A, the second sacrificial pillar 143C, and the support pillar 143B may serve as a support to reduce the deformation of the first horizontal spaces 151.

Figure 17C:
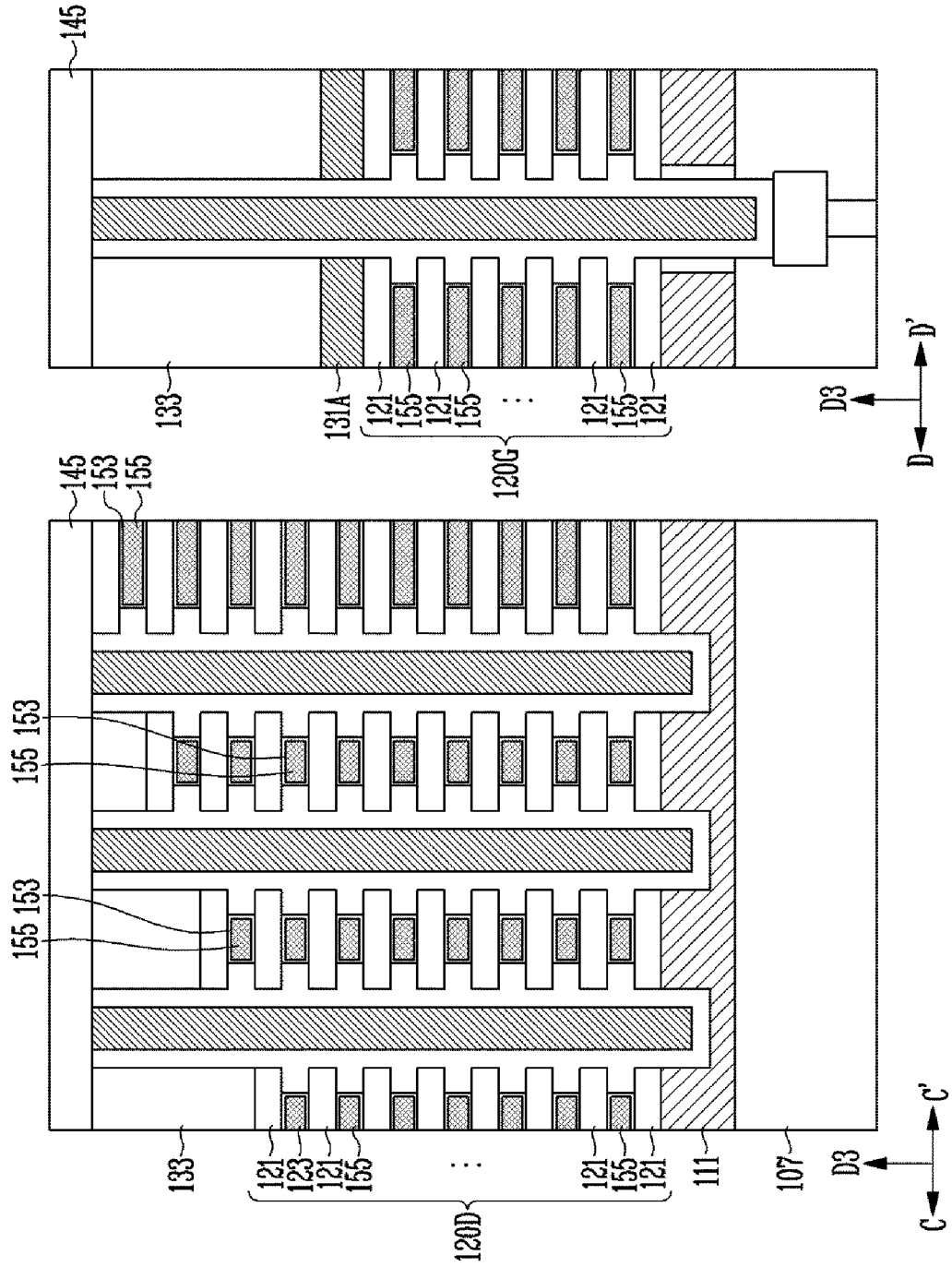

FIG. 17A is a plan view illustrating a step of forming the conductive patterns 155, FIG. 17B illustrates sections taken along line A-A' and line B-B' of FIG. 17A, and FIG. 17C illustrates sections taken along line C-C' and line D-D' of FIG. 17A.

Referring to FIGS. 17A to 17C, prior to forming the conductive patterns 155, a blocking insulating layer 153 may be formed on a surface of each of the first horizontal spaces 151 shown in FIGS. 16A and 16B. The blocking insulating layer 153 may include an oxide layer. In an embodiment, the blocking insulating layer 153 may include an aluminum oxide layer ($Al_2O_3$).

The step of forming the conductive patterns 155 may include a step of filling each of the first horizontal spaces 151 shown in FIGS. 16A and 16B with the conductive material, and a step of removing the conductive material from the interiors of the slits 148 to separate the conductive material into the conductive patterns 155. Thus, the gate stacks 120G and the dummy stepped structure 120D that are separated from each other by the slits 149 and each include the conductive patterns 155 and the interlayer insulating layers 121 that are alternately stacked may be formed.

Figure 19A:
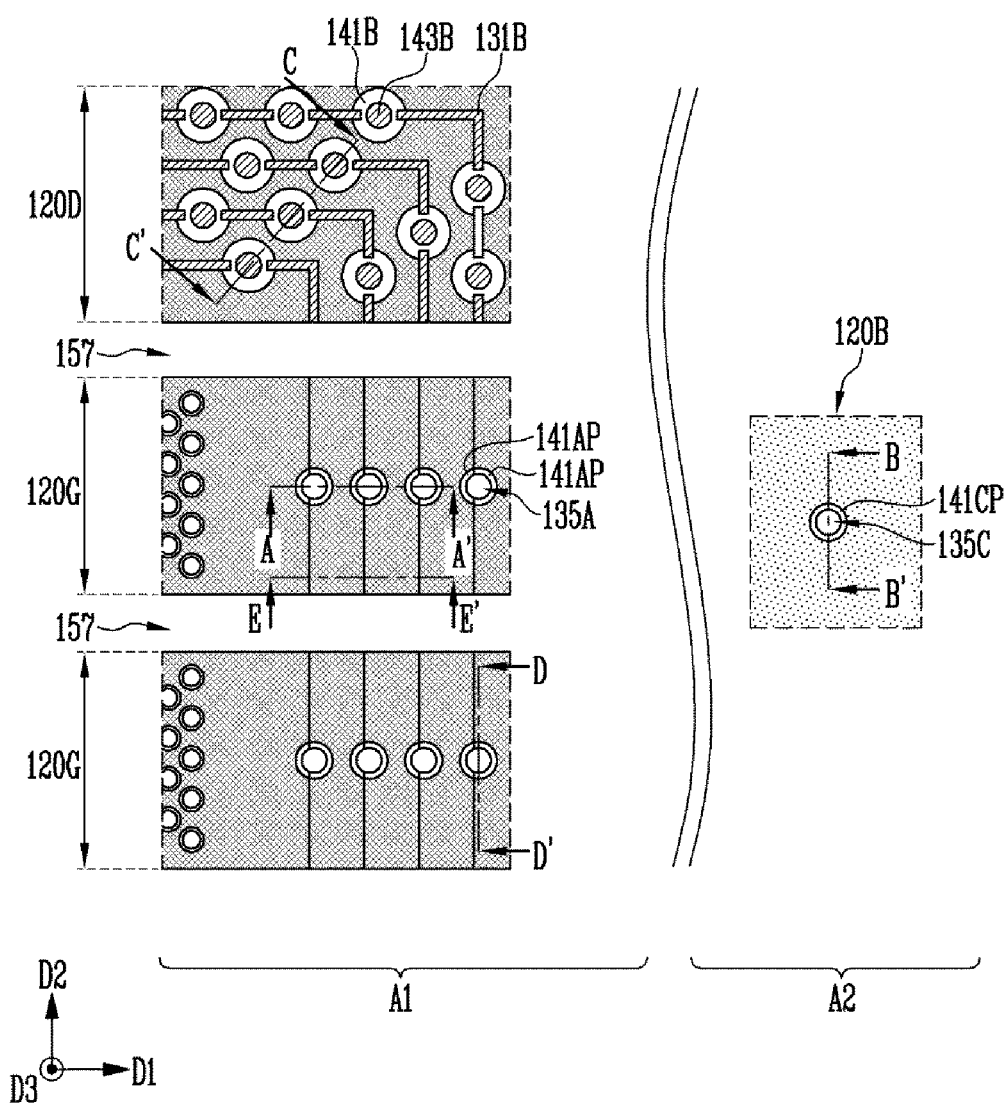

After the gate stacks 120G and the dummy stepped structure 120D are formed, each of the slits 149 may be filled with a vertical pattern 157 shown in FIG. 19A. The vertical pattern 157 may be formed of an insulating material, and may include the insulating material and a conductive material passing through the insulating material and coupled to the doped semiconductor layer 111.

Figure 18A:
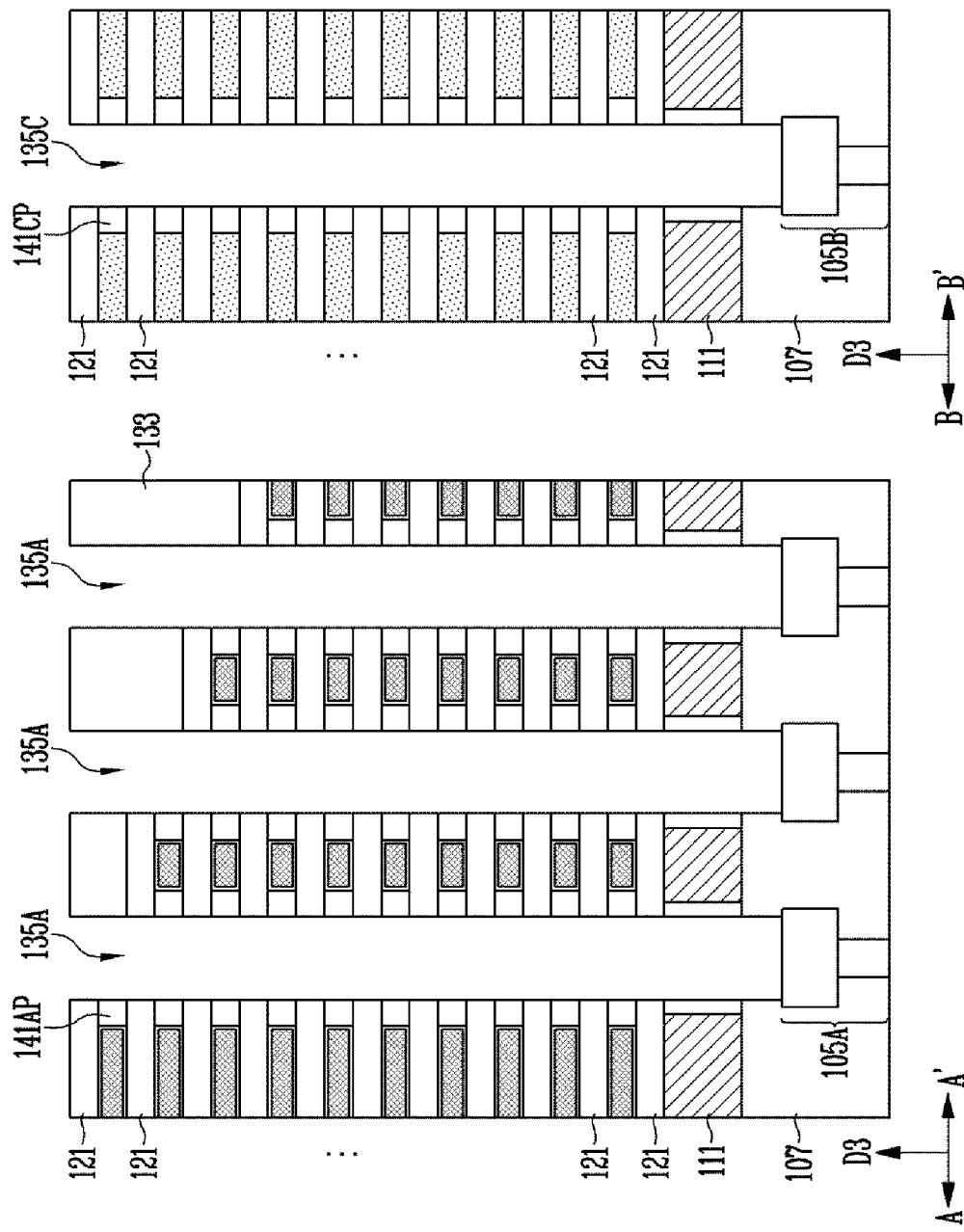

FIGS. 18A and 18B are sectional views illustrating a step of opening the first holes 135A and the third holes 135C.

Referring to FIGS. 18A and 18B, the step of opening the first holes 135A and the third holes 135C may include a step of forming a mask pattern 161 overlapping the dummy stepped structure 120D on the second upper insulating layer 145, a step of etching a portion of the second upper insulating layer 145 by an etching process using the mask pattern 161 as an etching barrier, a step of removing the first sacrificial pillars 143A and the second sacrificial pillar 143C shown in FIGS. 17A to 17C, and a step of etching a portion of each of the spacer insulating layers 141A so that the first sacrificial patterns 131A of FIG. 17A are exposed.

The step of etching a portion of the second upper insulating layer 145 may be performed so that the first sacrificial pillars 143A and the second sacrificial pillar 143C are exposed.

As the first sacrificial pillars 143A are removed, the spacer insulating layers 141A of FIGS. 17A to 17C may be exposed. The second sacrificial pillar 143C shown in FIGS. 17A and 17B may be removed while the first sacrificial pillars 143A are removed. As the second sacrificial pillar 143C is removed, the second dummy spacer insulating layer 141C shown in FIGS. 17A and 17B may be exposed. While the first sacrificial pillars 143A and the second sacrificial pillar 143C are removed, the support pillars 143B may be protected by the mask pattern 161.

A portion of each of the spacer insulating layers 141A may be removed so that the corresponding first interconnection structure 105A and the first sacrificial patterns 131A of the pad sacrificial layers are exposed. As the first sacrificial pillars 143A are removed and the spacer insulating layers 141A are etched, the first holes 135A may be opened. In an embodiment, each of the spacer insulating layers 141A may be separated into multiple spacer insulating patterns 141AP by the etching process. Each of the spacer insulating patterns 141AP may be disposed between adjacent interlayer insulating layers 121 in the third direction D3.

While a portion of each of the spacer insulating layers 141A is etched, a portion of the second dummy spacer insulating layer 141C may be etched. A portion of the second dummy spacer insulating layer 141C may be etched so that the second interconnection structure 105B is exposed. As the second sacrificial pillar 143C is removed and a portion of the second dummy spacer insulating layer 141C is etched, the second hole 135B may be opened. In an embodiment, the second dummy spacer insulating layer 141C may be separated into multiple second dummy spacer insulating patterns 141CP by the etching process. Each of the second dummy spacer insulating patterns 141CP may be disposed between adjacent interlayer insulating layers 121 in the third direction D3.

Figure 19C:
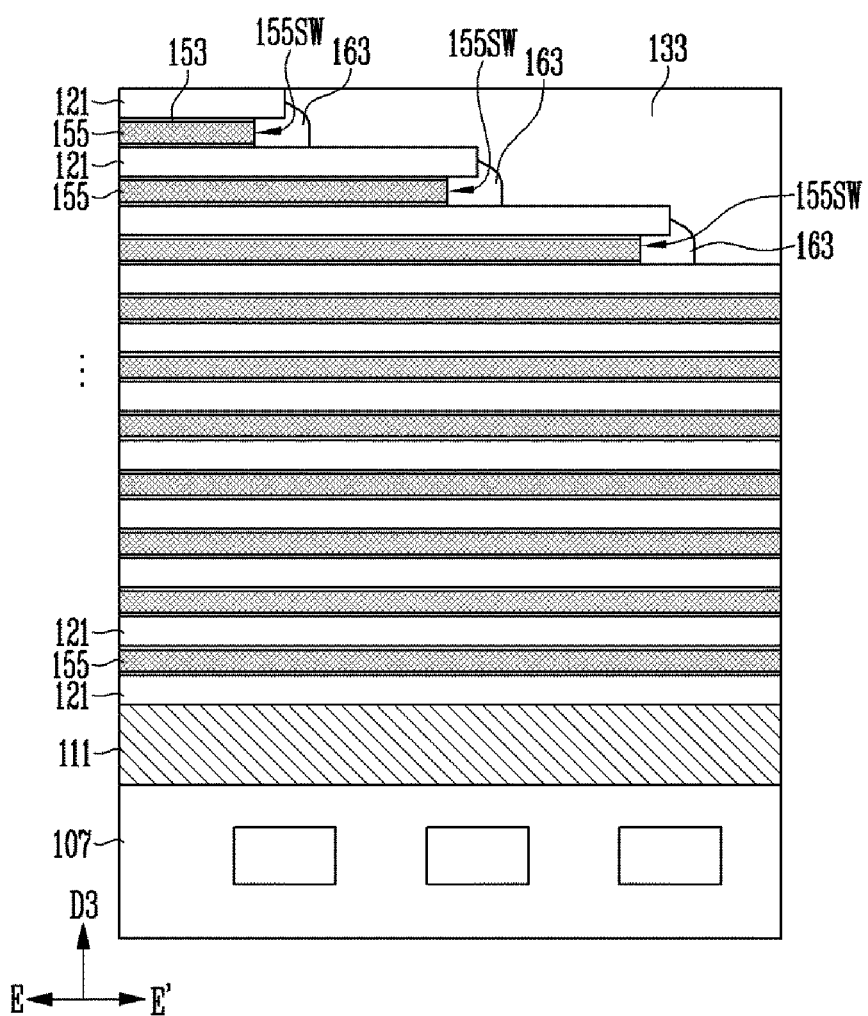

FIG. 19A is a plan view illustrating a step of forming the second horizontal spaces 163, FIG. 19B illustrates sections taken along line C-C' and line D-D' of FIG. 19A, and FIG. 19C illustrates a section taken along line E-E' of FIG. 19A.

Referring to FIGS. 19A to 19C, prior to forming the second horizontal spaces 163, the mask pattern 161 described with reference to FIGS. 18A and 18B may be removed.

The step of forming the second horizontal spaces 163 may include a step of removing the first sacrificial patterns 131A so that the blocking insulating layer 153 is exposed, and a step of etching the exposed portion of the blocking insulating layer 153. The second horizontal spaces 163 expose the sidewalls 155SW of the conductive patterns 155. The second horizontal spaces 163 may be defined between the first upper insulating layer 133 and the interlayer insulating layers 121 adjacent thereto. The second horizontal spaces 163 may be coupled to the first holes 135A, respectively.

While the first sacrificial patterns 131A are removed, the support pillar 143B and the second sacrificial patterns 131B may be protected by the second upper insulating layer 145.

Figure 20C:
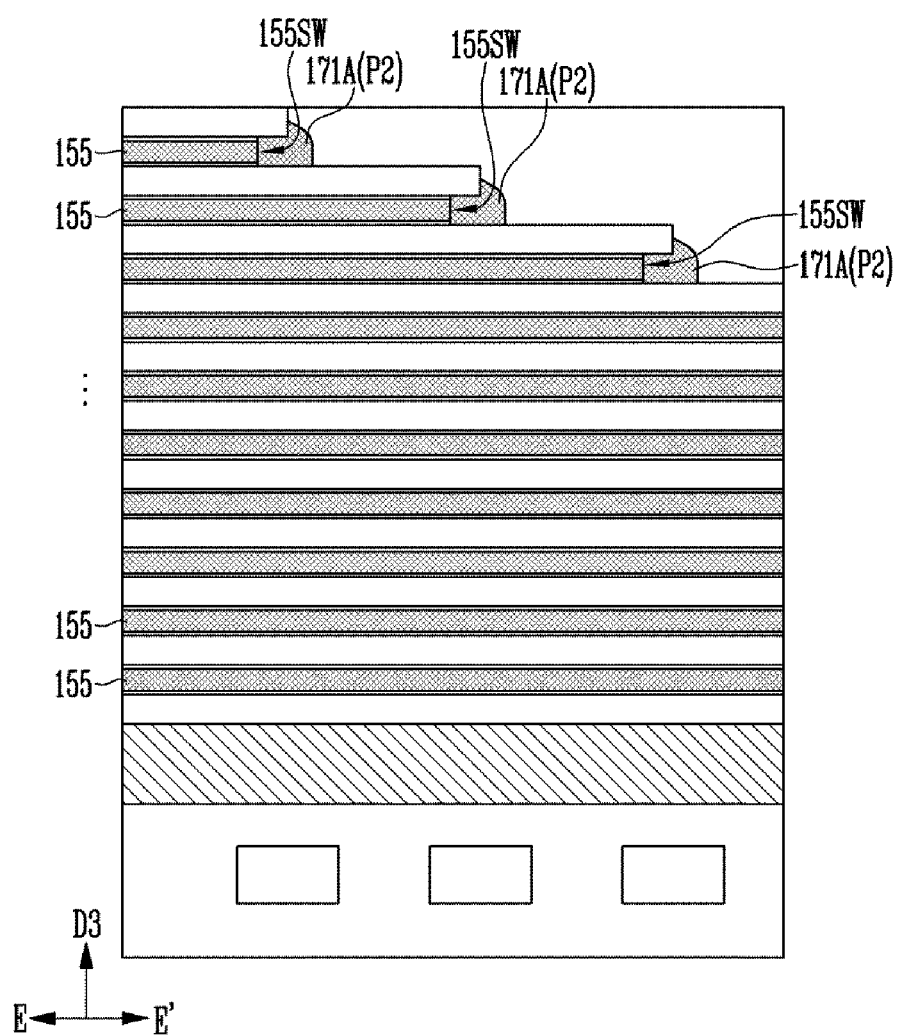

FIGS. 20A to 20C are sectional views illustrating a step of forming contact patterns 171A and a contact plug 171B.

Referring to FIGS. 20A to 20C, the step of forming the contact patterns 171A and the contact plug 171B may include a step of filling second horizontal spaces 163 described with reference to FIGS. 19B and 19C, first holes 135A, and a third hole 135C with a conductive material, and a step of removing a portion of the conductive material so that the support pillar 143B is exposed. The step of removing a portion of the conductive material may be performed so that the conductive material is separated into the contact patterns 171A and the contact plug 171B. In an embodiment, a portion of the conductive material may be removed through a chemical mechanical polishing method.

Each of the contact patterns 171A may fill the corresponding first hole 135A and the corresponding second horizontal space 163. Each of the contact patterns 171A may include a vertical contact part P1 filling the first hole 135A, and a sidewall contact part P2 filling the second horizontal space 163. The vertical contact part P1 of each of the contact patterns 171A may be spaced apart from the conductive patterns 155 through the spacer insulating patterns 141AP. The vertical contact part P1 of each of the contact patterns 171A may extend in the third direction D3 to come into contact with the corresponding first interconnection structure 105A. The sidewall contact part P2 of each of the contact patterns 171A may come into contact with a sidewall 155SW of the corresponding conductive pattern 155.

While the contact patterns 171A are formed, a contact plug 175B filling the third hole 135C may be formed. The contact plug 175B may extend in the third direction D3 to come into contact with the second interconnection structure 105B.

Although the embodiments of the present disclosure have been described with a semiconductor memory device implemented as a NAND flash memory device, the present disclosure is not limited thereto. The present disclosure may also be applied to a semiconductor memory device implemented as a DRAM memory device or a variable resistance memory device.

According to the embodiments of the present disclosure, even if each of the contact patterns 171A is formed to pass through the conductive patterns 155, the contact patterns 171A may be spaced apart from the conductive patterns 155 through the spacer insulating patterns 141AP of the spacer insulating layers. Thus, according to the embodiments of the present disclosure, a bridge failure between the conductive patterns 155 due to a punch phenomenon in which the contact patterns 171A pass through the conductive patterns 155 can be prevented. As a result, since it is unnecessary to add a process for improving the punch phenomenon, the present disclosure can simplify the process of manufacturing the semiconductor memory device.

Figure 21:
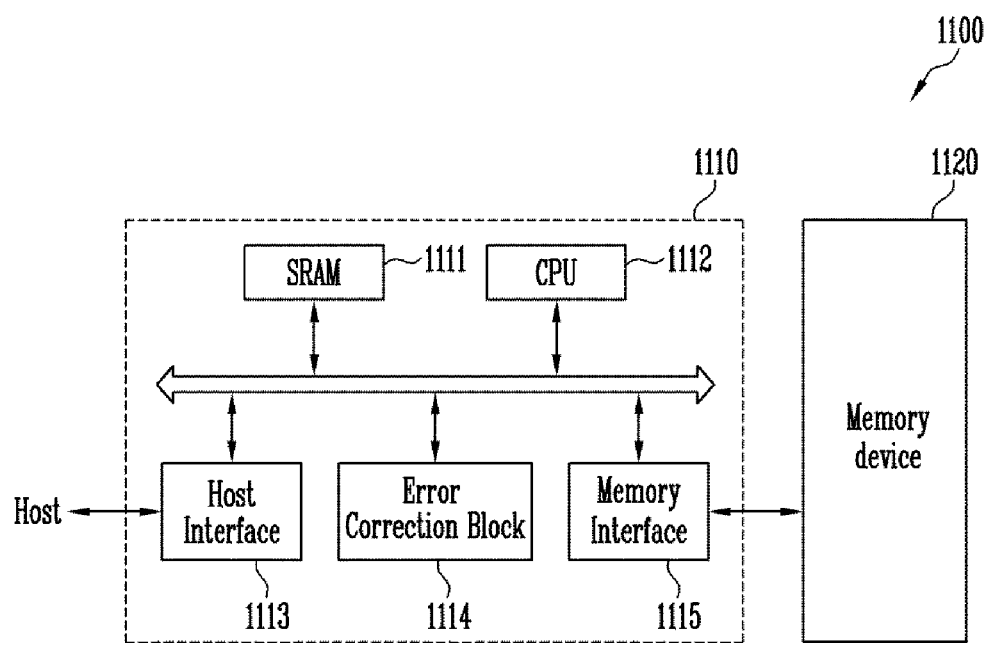
FIG. 21 is a block diagram illustrating the configuration of a memory system in accordance with an embodiment.

FIG. 21 is a block diagram illustrating the configuration of a memory system 1100 in accordance with an embodiment.

Referring to FIG. 21, the memory system 1100 includes a memory device 1120 and a memory controller 1110.

The memory device 1120 may be a multi-chip package formed of a plurality of flash memory chips. The memory device 1120 may include conductive patterns that are stacked while being spaced apart from each other, and a contact pattern that is coupled to a corresponding conductive pattern among the conductive patterns. The contact pattern may include a vertical contact part that passes through the conductive patterns, and a sidewall contact part that extends from the vertical contact part in a direction crossing the vertical contact part and in contact with the corresponding conductive pattern. The conductive patterns may form a memory cell array, and the contact pattern may be used as a structure for electrically connecting the corresponding conductive pattern to the peripheral circuit.

The memory controller 1110 may control the memory device 1120, and include a static random access memory (SRAM) 1111, a central processing unit (CPU) 1112, a host interface 1113, an error correction block 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. The correction block 1114 detects an error included in data read from the memory device 1120, and corrects the detected error. The memory interface 1115 may interface with the memory device 1120. The memory controller 1110 may further include a read only memory (ROM) or the like that stores code data for interfacing with a host.

The above-described memory system 1100 may be a memory card or a solid state drive (SSD) equipped with the memory device 1120 and the memory controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer small interface (SCSI), an enhanced small disk interface (ESDI), and an integrated drive electronics (IDE) protocols.

Figure 22:
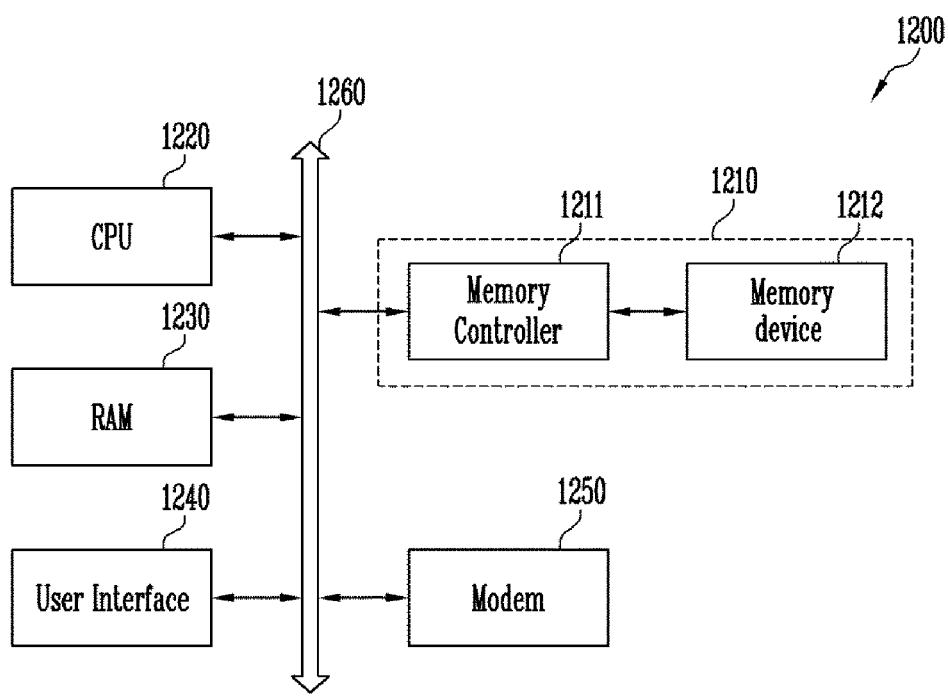
FIG. 22 is a block diagram illustrating the configuration of a computing system in accordance with an embodiment.

FIG. 22 is a block diagram illustrating the configuration of the computing system 1200 in accordance with an embodiment.

Referring to FIG. 22, the computing system 1200 may include a CPU 1220, a random access memory (RAM) 1230, a user interface 1240, a modem 1250, and a memory system 1210 that are electrically coupled to a system bus 1260. If the computing system 1200 is a mobile device, it may further include a battery for supplying an operating voltage to the computing system 1200. An application chip set, an image processor, an image sensor, a mobile DRAM and the like may be further included. The image sensor may include a complementary metal-oxide semiconductor (CMOS) image sensor (CIS).

The memory system 1210 may include a memory device 1212 and a memory controller 1211. The memory device 1212 may be configured in the same manner as that of the memory device 1120 described with reference to FIG. 21. The memory controller 1211 may be configured in the same manner as that of the memory controller 1100 described with reference to FIG. 21.

According to the present disclosure, since a vertical contact part of a contact pattern is spaced apart from a stack of conductive patterns, it may be possible to prevent the failure of a bridge in which the conductive patterns are electrically connected by the vertical contact part. Thereby, the present disclosure can improve process defects.

According to the present disclosure, since sacrificial pillars may be used as a support during the manufacturing process of a semiconductor memory device, the structural stability of the semiconductor memory device may be increased.

What is claimed is:

1. A method of manufacturing a semiconductor memory device, comprising:
    forming a preliminary stepped structure comprising interlayer insulating layers and horizontal sacrificial layers that are alternately stacked;
    forming a pad sacrificial layer on a sidewall of each of the horizontal sacrificial layers;
    forming a first hole passing through the pad sacrificial layer and the preliminary stepped structure;
    forming a spacer insulating layer on a sidewall of the first hole;
    forming a first sacrificial pillar on the spacer insulating layer to fill the first hole;
    removing the horizontal sacrificial layers;
    forming conductive patterns in horizontal spaces where the horizontal sacrificial layers are removed;
    removing the first sacrificial pillar to expose the spacer insulating layer;
    removing a portion of the spacer insulating layer to expose the pad sacrificial layer;
    removing the pad sacrificial layer; and
    forming a contact pattern that fills an area from which the pad sacrificial layer is removed and the first hole.

2. The method according to claim 1, wherein each of the interlayer insulating layers comprises an oxide layer, wherein each of the horizontal sacrificial layers comprises a nitride layer, and wherein each pad sacrificial layers comprises a material having higher etching resistance to phosphoric acid than the nitride layer.

3. The method according to claim 1, wherein the forming of the pad sacrificial layer on the sidewall of each of the horizontal sacrificial layers comprises:
  etching a portion of each of the horizontal sacrificial layers to form a first groove between the interlayer insulating layers that are adjacent to each other; and
  forming the pad sacrificial layer to fill the first groove.

4. The method according to claim 1,
  wherein a second hole passing through the pad sacrificial layer and the preliminary stepped structure is formed while the first hole is formed,
  wherein a first dummy spacer insulating layer is formed on a sidewall of the second hole while the spacer insulating layer is formed,
  wherein a support pillar filling the second hole is formed while the first sacrificial pillar is formed, and
  wherein the support pillar is protected by a mask pattern while the first sacrificial pillar is removed.

5. The method according to claim 1,
  wherein a dummy buffer stack comprising the interlayer insulating layers and the horizontal sacrificial layers is formed while the preliminary stepped structure is formed,
  wherein a third hole passing through the dummy buffer stack is formed while the first hole is formed,
  wherein a second dummy spacer insulating layer is formed on a sidewall of the third hole while the spacer insulating layer is formed,
  wherein a second sacrificial pillar filling the third hole is formed while the first sacrificial pillar is formed,
  wherein the second sacrificial pillar is removed while the first sacrificial pillar is removed,
  wherein a portion of the second dummy spacer insulating layer is removed while the portion of the spacer insulating layer is removed, and
  wherein a contact plug filling the third hole is formed while the contact pattern is formed.

6. The method according to claim 5,
  wherein the preliminary stepped structure and the dummy buffer stack are disposed on an interconnection array comprising first and second interconnection structures,
  wherein the contact pattern is coupled to the first interconnection structure, and
  wherein the contact plug is coupled to the second interconnection structure.

7. The method according to claim 6, further comprising:
  before the forming of the preliminary stepped structure,
  forming a doped semiconductor layer on the interconnection array; and
  forming insulating layers that pass through the doped semiconductor layer and overlap the first and second interconnection structures, respectively,
  wherein the contact pattern and the contact plug extend to pass through the insulating layers, respectively.

8. The method according to claim 1, wherein the forming of the spacer insulating layer comprises:
  etching the horizontal sacrificial layers through the first hole to form second grooves between the interlayer insulating layers; and
  forming the spacer insulating layer on the sidewall of the first hole to fill the second grooves.

9. The method according to claim 1, wherein the removing of the horizontal sacrificial layers comprises;
  forming a slit passing through the preliminary stepped structure; and
  removing the horizontal sacrificial layers through the slit so that the horizontal spaces between the interlayer insulating layers are opened.

10. The method according to claim 9, wherein the forming the conductive patterns comprises;
  forming a blocking insulating layer on a surface of each of the horizontal spaces; and
  forming conductive patterns filling the horizontal spaces, respectively, on the blocking insulating layer.

11. The method according to claim 10, further comprising, after the removing of the pad sacrificial layer, removing a portion of the blocking insulating layer so that a sidewall of each of the conductive patterns is exposed.

* * * * *